(12) United States Patent
Lu

(10) Patent No.: US 9,911,839 B2
(45) Date of Patent: Mar. 6, 2018

(54) RB-IGBT

(71) Applicant: FUJI ELECTRIC CO., LTD., Kanagawa (JP)

(72) Inventor: Hong-fei Lu, Hino (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/390,680

(22) Filed: Dec. 26, 2016

(65) Prior Publication Data

US 2017/0243962 A1   Aug. 24, 2017

(30) Foreign Application Priority Data

Feb. 19, 2016 (JP) .................. 2016-029818

(51) Int. Cl.
*H01L 29/08* (2006.01)
*H01L 29/66* (2006.01)
(Continued)

(52) U.S. Cl.
CPC ...... *H01L 29/7395* (2013.01); *H01L 29/0619* (2013.01); *H01L 29/0649* (2013.01); *H01L 29/0696* (2013.01); *H01L 29/0804* (2013.01); *H01L 29/0821* (2013.01); *H01L 29/1095* (2013.01); *H01L 29/404* (2013.01); *H01L 29/407* (2013.01); *H01L 29/417* (2013.01); *H01L 29/41708* (2013.01); *H01L 29/66333* (2013.01); *H01L 29/7397* (2013.01); *H01L 29/66348* (2013.01)

(58) Field of Classification Search
CPC ......... H01L 29/00; H01L 29/06; H01L 29/08; H01L 29/73; H01L 29/7395; H01L 29/10; H01L 29/66; H01L 29/76; H01L 29/78; H01L 29/94; H01L 29/739; H01L 29/0619; H01L 29/0649
USPC ........................................ 257/144
See application file for complete search history.

(56) References Cited

U.S. PATENT DOCUMENTS 8,748,976 B1   6/2014 Kocon et al.
2002/0048915 A1   4/2002 Reznik
(Continued)

FOREIGN PATENT DOCUMENTS

JP   2001-85688 A   3/2001
JP   3918625 B2    5/2007

*Primary Examiner* — Chuong A Luu

(57) ABSTRACT

An RB-IGBT is provided that has a new emitter trench structure with improved breakdown voltage achieved by improving the electrical field distribution of the drift region. The RB-IGBT includes an isolation region having a first conductivity type on a side surface of a semiconductor substrate. The semiconductor substrate includes a drift region having a second conductivity type; a collector region having the first conductivity type and provided farther downward than the drift region; and an emitter trench portion provided extending to the drift region in a thickness direction from a front surface to a back surface of the semiconductor substrate. The emitter trench portion includes a trench electrode electrically connected to an emitter electrode provided above the semiconductor substrate; an upper trench insulating film directly contacting a bottom portion and side portions of the trench electrode; and a lower trench insulating film provided below the upper trench insulating film.

12 Claims, 20 Drawing Sheets

(51) Int. Cl.
*H01L 29/739* (2006.01)
*H01L 29/06* (2006.01)
*H01L 29/10* (2006.01)
*H01L 29/417* (2006.01)
*H01L 29/40* (2006.01)

(56) References Cited

U.S. PATENT DOCUMENTS

| | | | |
|---|---|---|---|
| 2007/0138544 A1* | 6/2007 | Hirler | H01L 29/404 |
| | | | 257/330 |
| 2008/0164516 A1 | 7/2008 | Darwish | |
| 2008/0258211 A1 | 10/2008 | Sugi et al. | |
| 2009/0140327 A1 | 6/2009 | Hirao et al. | |
| 2009/0309156 A1* | 12/2009 | Darwish | H01L 29/41766 |
| | | | 257/332 |
| 2012/0104555 A1* | 5/2012 | Bobde | H01L 29/0696 |
| | | | 257/587 |

* cited by examiner

RB-IGBT

BACKGROUND

1. Technical Field

The present invention relates to an RB-IGBT (Reverse-Blocking Insulated Gate Bipolar Transistor).

2. Related Art

Conventionally, a trench-shaped source electrode is provided. Specifically, a source electrode is provided that spans from the bottom portion of the trench to a top portion of the trench, as shown in Patent Documents 1 and 2, for example.
Patent Document 1: Japanese Patent Application Publication No. 2009-135360
Patent Document 2: Japanese Patent Application Publication No. 2001-85688
In the present application, an RB-IGBT is provided that has a new emitter trench structure that has an improved breakdown voltage achieved by improving the electrical field distribution of the drift region.

SUMMARY

According to a first aspect of the present invention, provided is an RB-IGBT including an isolation region having a first conductivity type on a side surface of a semiconductor substrate, the RB-IGBT. The semiconductor substrate may include a drift region having a second conductivity type, a collector region having the first conductivity type, and an emitter trench portion. The collector region may be provided farther downward than the drift region. The emitter trench portion may be provided extending to the drift region in a thickness direction that is from a front surface of the semiconductor substrate to a back surface of the semiconductor substrate. The emitter trench portion may include a trench electrode, an upper trench insulating film, and a lower trench insulating film. The trench electrode may be is electrically connected to an emitter electrode provided above the semiconductor substrate. The upper trench insulating film may directly contact a bottom portion and side portions of the trench electrode. The lower trench insulating film may be provided below the upper trench insulating film.

The lower trench insulating film may have a dielectric constant that is lower than a dielectric constant of a semiconductor material of the drift region.

The dielectric constant of the lower trench insulating film may be less than 12.

A length of the trench electrode from a peak portion thereof to a bottom portion thereof may be greater than or equal to 10 µm and less than or equal to 20 µm. A length from the bottom portion of the trench electrode to the bottom portion of the lower trench insulating film may be greater than or equal to 40 µm and less than or equal to 50 µm.

A bottom portion of the emitter trench portion may be separated from the back surface of the semiconductor substrate by a distance that is less than or equal to 10 µm and greater than or equal to 20 µm.

The RB-IGBT may further comprise a second semiconductor region. The second semiconductor region may be provided on top of the drift region. The second semiconductor region may have an impurity concentration of impurities having the second conductivity type that is higher than an impurity concentration of impurities having the second conductivity type of the drift region. The second semiconductor region may be adjacent to the upper trench insulating film in a direction orthogonal to the thickness direction of the semiconductor substrate.

A boundary between the second semiconductor region and the drift region in the thickness direction of the semiconductor substrate may be positioned farther upward than a bottom portion of the trench electrode.

The RB-IGBT may further comprise a well region and a first semiconductor region. The well region may have the first conductivity type. The well region may be positioned on the front surface side of the semiconductor substrate. The first semiconductor region may have the second conductivity type. The first semiconductor region may be provided between the well region and the second semiconductor region.

An integrated value of the impurity concentration of impurities having the second conductivity type in the first and second semiconductor region from the boundary between the second semiconductor region and the drift region to the front surface of the semiconductor substrate may be greater than or equal to 1E+11 $cm^2$ and less than or equal to 5E+11 $cm^{-2}$.

The RB-IGBT may further comprise a third semiconductor region having the second conductivity type between the collector region having the first conductivity type and the drift region having the second conductivity type.

An integrated value of the impurity concentration of impurities having the second conductivity type in the third semiconductor region from a boundary between the third semiconductor region and the collector region to a boundary between the third semiconductor region and the drift region may be greater than or equal to 3E+11 $cm^{-2}$ and less than or equal to 10E+11 $cm^{-2}$.

When the front surface of the semiconductor substrate is seen from an overhead view, the emitter trench portion may be provided with a ring shape in a manner to sandwich at least one channel formation region that is directly below a gate electrode provided with a linear shape.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
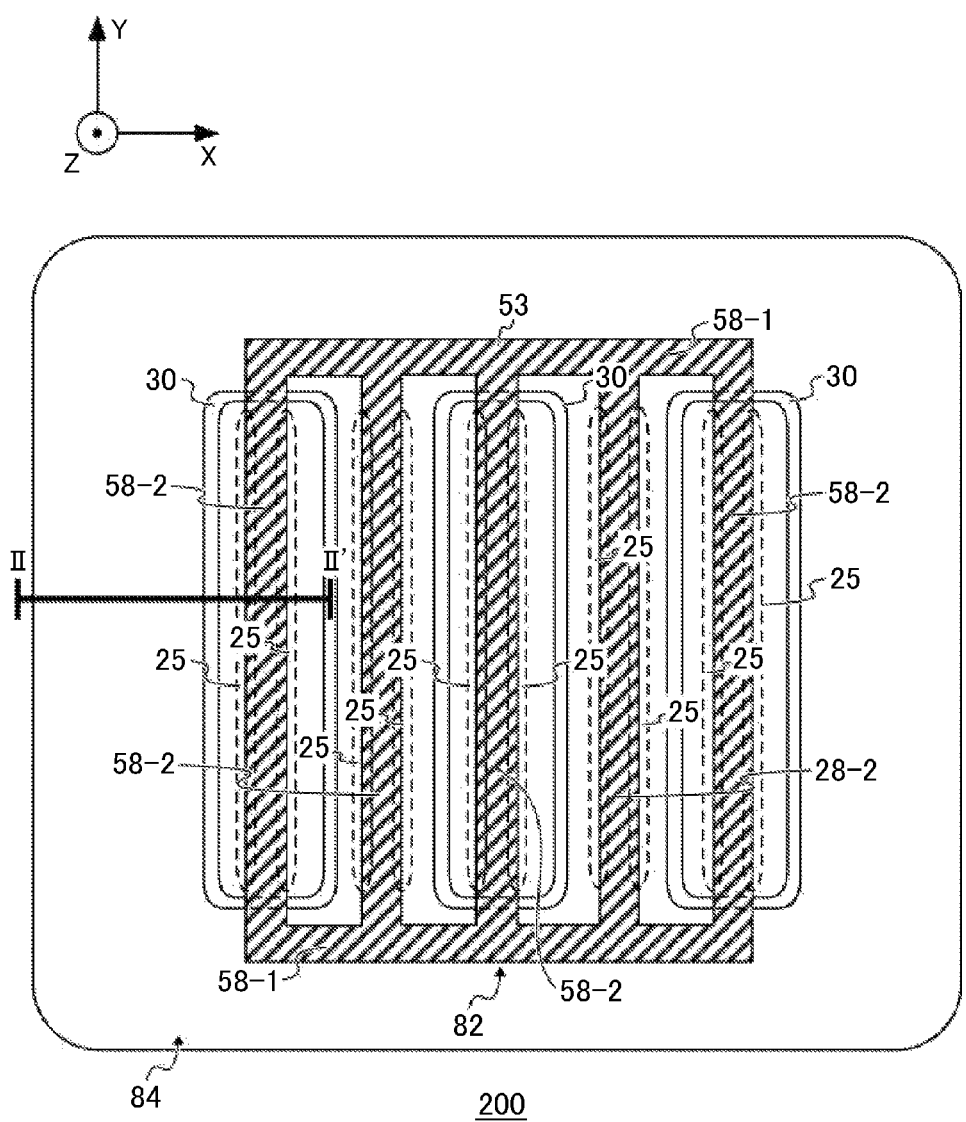
FIG. 1 is a schematic view of a top surface of an RB-IGBT 200 according to a first embodiment.

FIG. 1 is a schematic view of a top surface of an RB-IGBT 200 according to a first embodiment. The RB-IGBT 200 is formed using a semiconductor substrate. The semiconductor substrate in the present example has a front surface oriented in a +Z direction and a back surface oriented in a −Z direction. In other words, FIG. 1 is a schematic overhead view showing the front surface of the semiconductor substrate. In the present example, the front surface is the surface of the semiconductor substrate on which an emitter electrode described further below is provided, and the back surface is the surface of the semiconductor substrate on which a collector electrode described further below is provided.

In the present example, an X direction and a Y direction are perpendicular to each other, and the Z direction is perpendicular to the X-Y plane. The X direction, the Y direction, and the Z direction form a so-called right-handed system. In the present example, terms such as "up," "top," and "above" refer to the +Z direction, and terms such as "down," "bottom," and "below" refer to the −Z direction. The X direction, the Y direction, and the Z direction are merely expedient directions for describing position relationships of the configurational components, and do not specify absolute positional relationships.

FIG. 1 shows only an active region 82 and a termination region 84, and other components are not shown. The active region 82 includes a plurality of emitter trench portions 30, a plurality of channel formation regions 25, and a gate electrode 53. The gate electrode 53 in the present example is a so-called planar gate electrode, and therefore the emitter trench portions 30 are positioned farther downward than the gate electrode 53.

The gate electrode 53 includes a plurality of linear portions 58-1 provided with straight line shapes extending in the X direction and a plurality of linear portions 58-2 provided with straight line shapes extending in the Y direction. The linear portions 58-1 extending in the X direction connect to the Y-direction ends of the linear portions 58-2 extending in the Y direction. The linear portions 58-2 extending in the Y direction are provided at a distance from each other.

The channel formation regions 25 are positioned directly below the linear portions 58-2 extending in the Y direction. In FIG. 1, the channel formation regions 25 are indicated by dotted lines. The channel formation regions 25 are regions where an inversion layer of a base region is formed when a prescribed voltage is applied to the gate electrode 53.

In an overhead view of the front surface of the semiconductor substrate, the emitter trench portions 30 are formed with ring shapes. In the overhead view, each emitter trench portion 30 is provided in a manner to sandwich at least one channel formation region 25 in the X direction. Each emitter trench portion 30 in the present example is provided in a manner to surround one linear portion 58-2 and two channel formation regions 25 positioned on the −X direction side and the +X direction side of this linear portion 58-2. In the present example, the number of channel regions is set to be the number of independent island shapes. The long portions of the ring shape of each emitter trench portion 30 are parallel to the Y direction. Furthermore, the emitter trench portions 30 in the present example are arranged in the X direction in correspondence with every other linear portion 58-2.

A termination region 84 is provided around the active region 82. The termination region 84 has a function of improving the breakdown voltage of the RB-IGBT 200. The termination region 84 in the present example includes a field limiting ring and a p-type isolation region, which are described further below.

In the present example, "n" and "p" respectively refer to a state in which electrons are the majority carrier and a state in which holes are the majority carrier. The "+" and "−" signs written to the upper right of "n" and "p" respectively mean that the carrier concentration is higher than in a case where a "+" sign is not written and that the carrier concentration is lower than in a case where a "−" sign is not written. In the examples in this Specification, the first conductivity type is p-type and the second conductivity type is n-type. However, as another example, the first conductivity type may be n-type and the second conductivity type may be p-type.

Figure 2:
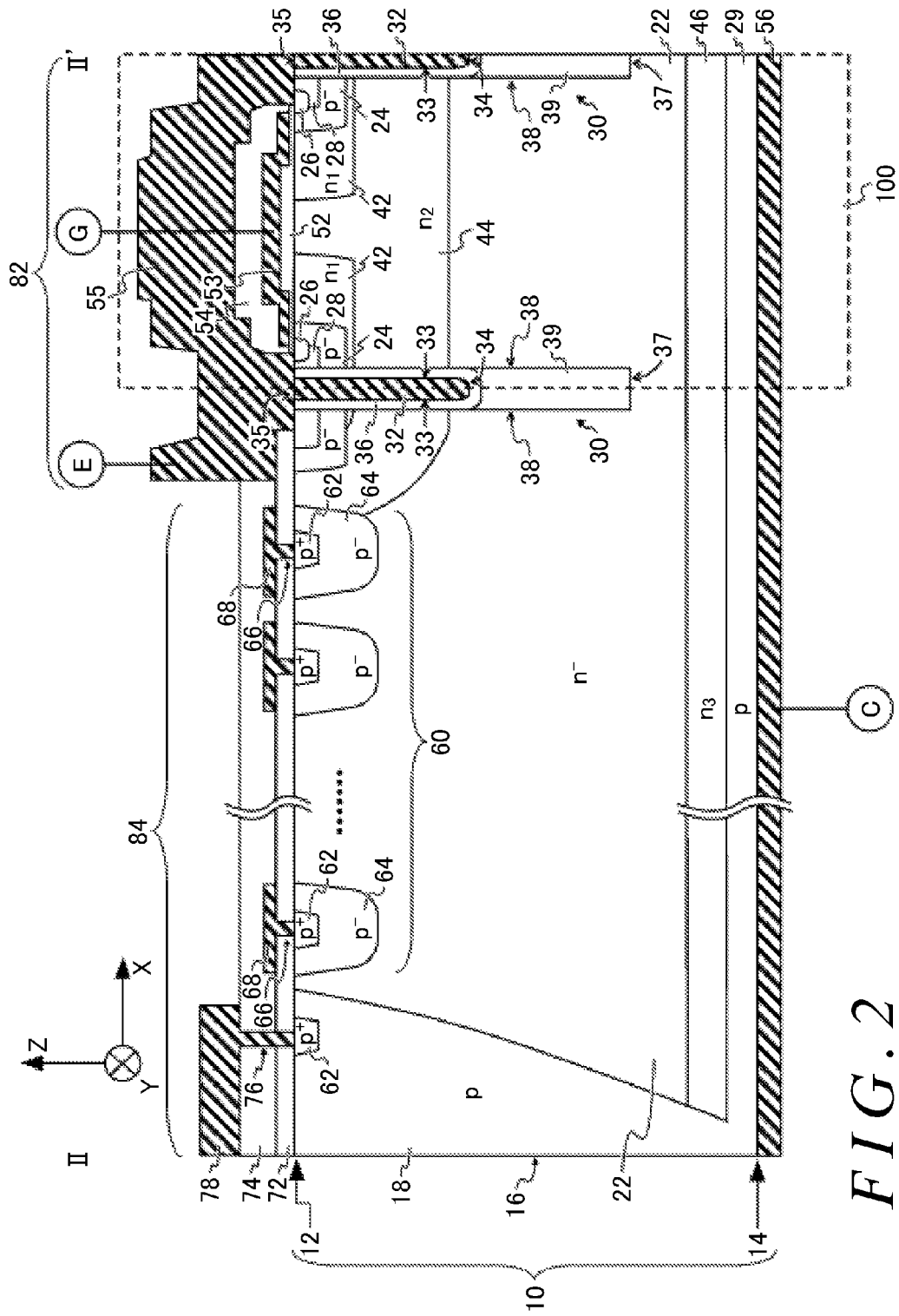
FIG. 2 shows the II-II' cross section from FIG. 1.

FIG. 2 shows the II-II' cross section from FIG. 1. The semiconductor substrate 10 has the front surface 12 and the back surface 14. The semiconductor substrate 10 includes a p-type collector region 29, an $n_3$ region 46 serving as a third semiconductor region, and an $n^-$-type drift region 22, in the stated order from the back surface 14 toward the front surface 12. In other words, the $n_3$ region 46 is provided between the p-type collector region 29 and the $n^-$-type drift region 22.

The RB-IGBT 200 includes a collector electrode 56 provided below the p-type collector region 29, which is provided below the $n^-$-type drift region 22. A collector terminal is electrically connected to the collector electrode 56. The collector terminal is shown in the drawing by an encircled "C." The following describes each component separately in the active region 82 and in the termination region 84.

(The Active Region 82)

In the active region 82, the semiconductor substrate 10 includes an $n_2$ region 44 serving as a second semiconductor region, an $n_1$ region 42 serving as a first semiconductor region, a $p^-$-type base region 24 serving as a well region with a first conductivity type, a p$^+$-type contact region 28, and an n$^+$-type emitter region 26, in the stated order from the back surface 14 toward the front surface 12. The unit structure of an IGBT in the active region 82 is indicated by the unit structure 100.

A gate insulating film 52 and a gate electrode 53 are provided above the p$^-$-type base region 24 exposed in the front surface 12. The p$^-$-type base region 24 directly below the gate insulating film 52 and the gate electrode 53 has a channel region formed in the channel formation region 25 when a prescribed positive voltage is applied to the gate electrode 53. The gate electrode 53 and the emitter electrode 55 are electrically insulated from each other by an interlayer insulating film 54.

When a prescribed potential difference occurs between the emitter electrode 55 and the collector electrode 56 and the prescribed positive voltage is applied to the gate electrode 53, current flows through the channel. Specifically, an electron current flows from the emitter electrode 55 toward the collector electrode 56, and a hole current flows from the collector electrode 56 toward the emitter electrode 55. At this time, conductivity modulation occurs, and the n$_1$ region 42, the n$_2$ region 44, and the n$^-$-type drift region 22 enter a low resistance state.

The p$^-$-type base region 24, the n$^+$-type emitter region 26, the p$^+$-type contact region 28, the n$_1$ region 42, and the n$_2$ region 44 are positioned on the front surface 12 side in the semiconductor substrate 10. The p$^+$-type contact region 28 is electrically connected to the emitter electrode 55. An emitter terminal is electrically connected to the emitter electrode 55. The emitter terminal is shown in the drawing by an encircled "E."

The p$^+$-type contact region 28 contacts the n$^+$-type emitter region 26 and is provided from the front surface 12 to a position farther downward than the n$^+$-type emitter region 26. The p$^-$-type base region 24 contacts the n$^+$-type emitter region 26 and the p$^+$-type contact region 28, and is provided from the front surface 12 to a position farther downward than the n$^+$-type emitter region 26 and the p$^+$-type contact region 28. The n$_1$ region 42 contacts the p$^+$-type contact region 28 and is provided to a position farther downward than the p$^+$-type contact region 28. The n$_2$ region 44 contacts the n$_1$ region 42, and is provided to a position farther downward than the n$_1$ region 42.

The n$_1$ region 42 is provided between the p$^-$-type base region 24 and the n$_2$ region 44. The n$_1$ region 42 has an n-type impurity concentration that is higher than that of the n$^-$-type drift region 22. The n$_2$ region 44 is provided on top of the n$^-$-type drift region 22. The n$_2$ region 44 in the present example has an n-type impurity concentration that is higher than that of the n$^-$-type drift region 22.

The n$_2$ region 44 is adjacent to the upper trench insulating film 36 in a direction orthogonal to the thickness direction of the semiconductor substrate 10. The n$_2$ region 44 is adjacent to the upper trench insulating film 36 in the X direction. In the present example, the thickness direction is a direction parallel to the Z direction. In the present example, the thickness direction of the semiconductor substrate 10 from the front surface 12 to the back surface 14 is the −Z direction, and the thickness direction of the semiconductor substrate 10 from the back surface 14 to the front surface 12 is the +Z direction.

The n$_1$ region 42, the n$_2$ region 44, and the n$_3$ region 46 each have an n-type impurity concentration that is higher than that of the n$^-$-type drift region 22. Therefore, the depletion layer has more difficulty expanding in the n$_1$ region 42, the n$_2$ region 44, and the n$_3$ region 46 than in the n$^-$-type drift region 22. In the present example, this phenomenon is referred to as a field retarding effect. Due to the field retarding effect, it is difficult for the depletion layer expanding from the n$_1$ region 42, the n$_2$ region 44, and the n$_3$ region 46 to reach the front surface 12 and the back surface 14 of the semiconductor substrate 10. Therefore, the semiconductor substrate 10 in the present example can have a smaller wafer thickness from the front surface 12 to the back surface 14 than in a case where the n$_1$ region 42, the n$_2$ region 44, and the n$_3$ region 46 are not provided.

The semiconductor substrate 10 includes an emitter trench portion 30 that extends to the n$^-$-type drift region 22 in the −Z direction. The emitter trench portion 30 has a bottom portion 37 and side portions 38. The emitter trench portion 30 includes a trench electrode 32, an upper trench insulating film 36, and a lower trench insulating film 39.

The trench electrode 32 is an electrode formed of a conductive material. The trench electrode 32 in the present example is an electrode formed of polysilicon. The trench electrode 32 is electrically connected to an emitter electrode 55 provided above the semiconductor substrate 10, at a peak portion 35 thereof. In this way, the trench electrode 32 becomes the same potential as the emitter electrode 55. Therefore, the trench electrode 32 can function as a field plate that relaxes and weakens the focusing of the electrical field.

The bottom portion 34 of the trench electrode 32 in the present example is positioned on the back surface 14 side of the bottom end of the n$_2$ region 44. The trench electrode 32 can relax and weaken the focusing of the electrical field at a p-n junction and an n-n junction. The trench electrode 32 in the present example can relax and weaken the focusing of the electrical field at a p-n junction between the p$^-$-type base region 24 and the n$_1$ region 42, an n-n junction between the n$_1$ region 42 and the n$_2$ region 44, and an n-n junction between the n$_2$ region 44 and the n$^-$-type drift region 22.

The upper trench insulating film 36 is provided in the emitter trench portion 30. The upper trench insulating film 36 is provided in direct contact with the bottom portion 34 and side portions 33 of the trench electrode 32. The upper trench insulating film 36 in the present example is a silicon oxide film. The upper trench insulating film electrically insulates the trench electrode 32 from the semiconductor substrate 10.

The lower trench insulating film 39 is also provided in the emitter trench portion 30. The lower trench insulating film 39 is provided below the upper trench insulating film 36. The lower trench insulating film 39 in the present example extends farther to the back surface 14 side of the semiconductor substrate 10 than the upper trench insulating film 36. However, it should be noted that the lower trench insulating film 39 does not reach the n$_3$ region 46. In other words, the n$^-$-type drift region 22 is present between the lower trench insulating film 39 and the n$_3$ region 46.

The lower trench insulating film 39 has a function of improving the breakdown voltage. In the present example, the electrical field distribution is not continuous at the bottom portion 37 of the lower trench insulating film 39. In other words, there is a jump in the electrical field strength distribution in the Z direction at a boundary that is the X-Y plane including the bottom portion 37 of the lower trench insulating film 39. This jump in the electrical field strength distribution causes an increase in the electrical field strength of the n$^-$-type drift region 22, and therefore it is possible to improve the breakdown voltage of the semiconductor substrate 10. In the present example, the bottom portion 37 of the lower trench insulating film 39 and the bottom portion 37 of the emitter trench portion 30 are matching.

Usually, the breakdown voltage and the thickness of the semiconductor substrate 10 are proportional. However, it should be noted that in the present example, the breakdown voltage is improved due to the function of the lower trench insulating film 39. Therefore, in a case where the semiconductor substrate 10 in the present example and a semiconductor substrate 10 that does not include the emitter trench portion 30 have the same breakdown voltage, the semiconductor substrate 10 in the present example can be thinner.

The lower trench insulating film 39 has a dielectric constant that is lower than the dielectric constant of the semiconductor material of the n⁻-type drift region 22. In a case where the semiconductor substrate 10 is silicon, the dielectric constant of the n⁻-type drift region 22 is approximately 12. The dielectric constant of the lower trench insulating film 39 may be less than 12. The lower trench insulating film 39 in the present example is a CVD oxide film or an SOG (Spin On Glass) film. The CVD oxide film and the SOG film are films that include silicon oxide. Generally, the dielectric constant of an SOG film is from 2 to 5.

As described in detail further below, the ratio ($\in_{39}/\in_{22}$) between the dielectric constant $\in_{39}$ of the lower trench insulating film 39 and the dielectric constant $\in_{22}$ of the n⁻-type drift region 22 is proportional to the jump in the electrical field strength distribution. Specifically, the smaller the dielectric constant $\in_{39}$ is relative to the dielectric constant $\in_{22}$, the larger the degree of the jump in the electrical field strength distribution can be made. In the present example, a CVD oxide film or SOG film is used instead of silicon as the lower trench insulating film 39. In this way, it is possible to achieve a jump in the electrical field strength distribution in the Z direction at a boundary that is the X-Y plane including the bottom portion 37 of the lower trench insulating film 39.

(The Termination Region 84)

The RB-IGBT 200 in the present example has a p-type isolation region 18 with the first conductivity type in the side surfaces 16 of the semiconductor substrate 10. The termination region 84 includes the p-type isolation region 18 in the side surfaces 16 of the semiconductor substrate 10. The termination region 84 includes a field limiting ring 60 between the p-type isolation region 18 and the active region 82.

The p-type isolation region 18 is provided spanning from the front surface 12 of the semiconductor substrate 10 to the p-type collector region 29. In an overhead view of the semiconductor substrate 10, the p-type isolation region 18 is formed as a ring surrounding the field limiting ring 60 and the active region 82.

The p-type isolation region 18 has a function of preventing the depletion layer from reaching the side surface 16 of the semiconductor substrate 10 formed by dicing. In this way, it is possible to prevent the leak current resulting from carriers being transported to the active region 82 due to the depletion layer reaching the side surface 16. By restricting the leak current, the breakdown voltage during the application of a reverse voltage can be improved compared to a case where the p-type isolation region 18 is not included.

The field limiting ring 60 includes a p⁻-type region 64 that is ring-shaped in an overhead view and a p⁺-type region 62 that is well-shaped. In the cross-sectional view shown in FIG. 2, the p⁻-type region 64 and the p⁺-type region 62 are both well-shaped. The p⁻-type region 64 contacts the p⁺-type region 62 in the X-Y plane and at a position farther downward than the front surface 12.

The field limiting ring 60 is provided with a circular ring shape that surrounds the active region 82 in the X-Y plane. The field limiting ring 60 has a function of causing the depletion layer generated at the active region 82 to expand to the termination region 84. By causing the depletion layer to expand to the termination region 84, the focusing of the electrical field is weakened and the electrical field is relaxed, and therefore the breakdown voltage can be improved.

A first interlayer insulating film 72 and a second interlayer insulating film 74 are provided on top of the front surface 12 of the termination region 84. Furthermore, a polysilicon field plate 68 is provided on top of the first interlayer insulating film 72, above the p⁻-type region 64. The polysilicon field plate 68 is electrically connected to the p⁺-type region 62 through a via 66 provided in the first interlayer insulating film 72. In this way, the field limiting ring 60, which is easily affected by charge, is electrically shielded from the outside environment. For example, the polysilicon field plate 68 can block mobile ions that can flow in from a passivation resin layer provided in the topmost portion of the RB-IGBT 200.

The p⁺-type region 62 is also provided in the front surface 12 of the p-type isolation region 18. A metal field plate 78 is provided above the p-type isolation region 18, with the first interlayer insulating film 72 and the second interlayer insulating film 74 interposed therebetween. The metal field plate 78 is electrically connected to the p⁺-type region 62 through a via 76 provided in the first interlayer insulating film 72 and the second interlayer insulating film 74. In this way, it is possible to electrically shield the p-type isolation region 18 from the outside environment by using the metal field plate 78.

Figure 3:
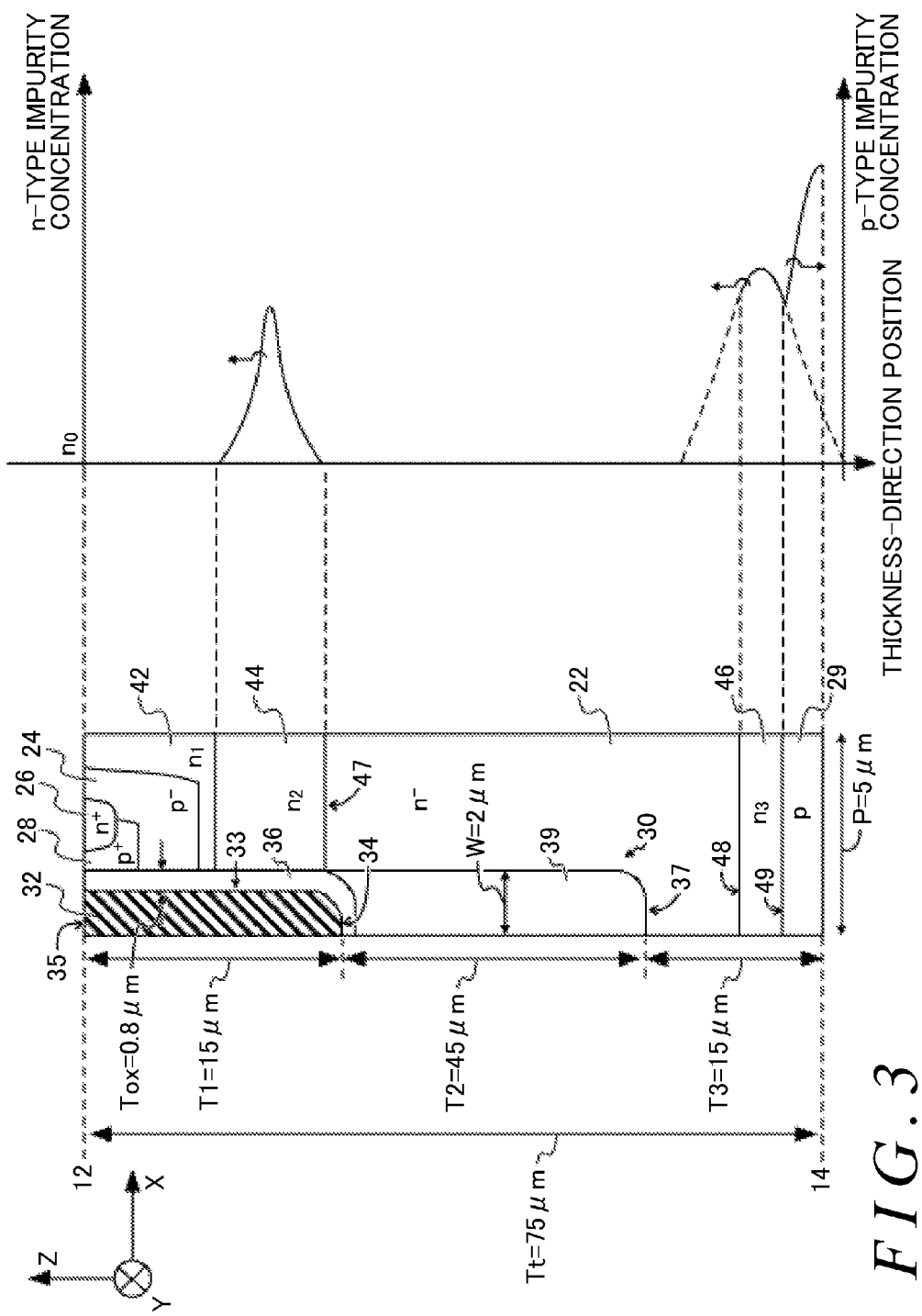
FIG. 3 is a drawing for describing the unit structure 100.

FIG. 3 is a drawing for describing the unit structure 100. A half-length of the unit structure 100 in the X direction is shown on the left side of FIG. 3. In the present example, the half-length P of the unit structure 100 in the X direction is 5 μm. Furthermore, in FIG. 3, a schematic view of the impurity concentration distribution in the $n_2$ region 44 and the $n_3$ region 46 is shown on the right side.

On the right side in FIG. 3, the vertical axis indicates the position in the thickness direction, the upper horizontal axis indicates the n-type impurity concentration, and the lower horizontal axis indicates the p-type impurity concentration. As shown on the right side in FIG. 3, the n-type impurity concentration of the n⁻-type drift region 22 has a reference value $n_0$. In the present example, the boundary 47 between the n⁻-type drift region 22 and the $n_2$ region 44 is a position where the n-type impurity concentration first exceeds the reference value $n_0$ when progressing from the n⁻-type drift region 22 toward the $n_2$ region 44. In the same manner, the boundary 48 between the n⁻-type drift region 22 and the $n_3$ region 46 is a position where the n-type impurity concentration first exceeds the reference value $n_0$ when progressing from the n⁻-type drift region 22 toward the $n_3$ region 46. Furthermore, the boundary 49 between the $n_3$ region 46 and the p-type collector region 29 is a position that is the valley between the peak of the n-type impurity concentration of the $n_3$ region 46 and the peak of the p-type impurity concentration of the p-type collector region 29.

As shown on the left side in FIG. 3, in the emitter trench portion 30, the length of the trench electrode 32 from the peak portion 35 to the bottom portion 34 may be greater than or equal to 10 μm and less than or equal to 20 μm. In the present example, the uppermost portion of the trench electrode 32 matches the front surface 12. In the present example, the length T1 of the trench electrode 32 from the peak portion 35 to the bottom portion 34 is 15 μm. If T1 is less than 10 μm, the effect of the trench electrode 32 as a field plate is weakened. Furthermore, if T1 is greater than 20 μm, manufacturing of the trench electrode 32 becomes difficult. Therefore, T1 is preferably greater than or equal to 10 μm and less than or equal to 20 μm.

As another example, the topmost portion of the trench electrode 32 may be at a position farther upward or farther downward than the front surface 12. In this case, the length from the front surface 12 of the semiconductor substrate 10 to the bottom portion 34 may be greater than or equal to 10 μm and less than or equal to 20 μm. Since the trench electrode 32 and the emitter electrode 55 electrically have the same potential, the function of the trench electrode 32 in this case as well is not limited or changed.

The length from the bottom portion 34 of the trench electrode 32 to the bottom portion 37 of the lower trench insulating film 39 may be greater than or equal to 40 μm and less than or equal to 50 μm. In the present example, the length T2 from the bottom portion 34 of the trench electrode 32 to the bottom portion 37 of the lower trench insulating film 39 is 45 μm.

The total length T1+T2 of the emitter trench portion 30 in the Y direction may be greater than or equal to 50 μm and less than or equal to 70 μm. In the present example, T1+T2 is 60 μm. The emitter trench portion 30 in the present example has a half-width W of 2 μm in the X direction. In other words, the width of the emitter trench portion 30 in the present example is 4 μm in the X direction. The emitter trench portion 30 in the present example has a Y direction:X direction aspect ratio of 60:4. However, as another example, the aspect ratio of the emitter trench portion 30 does not need to be limited to 60:4. The total length T1+T2 in the Y direction may be changed as desired according to the width W in the X direction.

The bottom portion 37 of the emitter trench portion 30 may be separated from the back surface 14 of the semiconductor substrate 10 by a distance greater than or equal to 10 μm and less than or equal to 20 μm. In the present example, the length T3 from the bottom portion 37 of the emitter trench portion 30 to the back surface 14 is 15 μm. If T3 is less than 10 μm, the emitter trench portion 30 is too deep, and therefore the machining of the semiconductor substrate 10 becomes difficult. In the present example, "deep" refers to a position in the thickness direction that is relatively close to the back surface 14. Furthermore, "shallow" refers to a position in the thickness direction that is relatively near the front surface 12. If T3 is less than 10 μm, the area of the p-type collector region 29 that effectively functions as the collector region is reduced. Therefore, T3 is preferably greater than or equal to 10 μm. The upper limit for T3 is set at 20 μm because the breakdown voltage is improved by providing the lower trench insulating film 39 as much as possible on the back surface 14 side.

When T3 is less than 10 μm, the breakdown voltage of the RB-IGBT 200 increases when a forward voltage is applied, compared to a case where T3 is greater than or equal to 10 μm and less than or equal to 20 μm. However, when T3 is less than 10 μm, the breakdown voltage of the RB-IGBT 200 decreases when a reverse voltage is applied, compared to a case where T3 is greater than or equal to 10 μm and less than or equal to 20 μm. Therefore, in order to strike a balance between the breakdown voltage of the RB-IGBT 200 when a forward voltage is applied and when a reverse voltage is applied, T3 is preferably greater than or equal to 10 μm and less than or equal to 20 μm. The forward voltage refers to a voltage applied between the collector electrode 56 and the emitter electrode 55 when the collector electrode 56 is a higher potential than the emitter electrode 55. Furthermore, the reverse voltage refers to a voltage applied between the collector electrode 56 and the emitter electrode 55 when the emitter electrode 55 has a higher potential than the collector electrode 56.

The film thickness Tox of the upper trench insulating film 36 in the present example is 0.8 μm. In contrast, as an example, when the gate electrode and the gate insulating film are shaped as trenches, the film thickness of the gate insulating film usually needs to be approximately from 100 nm to 200 nm in order for the threshold voltage to be approximately 5 [V] and not become too high. Furthermore, in this case, there is a limit placed on the maximum value of the n-type impurity concentration in the $n_2$ region 44 adjacent to the gate insulating film in order to form the inversion layer adjacent to the gate insulating film.

In contrast, in the present example, the gate electrode and the gate insulating film are not shaped as trenches, and the emitter trench portion 30 is shaped as a trench. Therefore, the film thickness Tox of the upper trench insulating film 36 does not need to have a thickness that takes the threshold voltage into consideration. The film thickness Tox of the upper trench insulating film 36 in the present example can be set to 0.8 μm, which is thicker than a trench-shaped gate insulating film. Therefore, the breakdown voltage can be made higher than in the case of a trench-shaped gate insulating film. Furthermore, in the present example, the n-type impurity concentration in the $n_2$ region 44 adjacent to the upper trench insulating film 36 can be made higher than in the case where the gate electrode and the gate insulating film are shaped as trenches. Accordingly, the wafer thickness can be reduced due to the field retarding effect.

Furthermore, in the present example, boundary 47 between the $n_2$ region 44 and the $n^-$-type drift region 22 in the thickness direction of the semiconductor substrate 10 is positioned farther upward than the bottom portion 34 of the trench electrode 32. As described above, the trench electrode 32 having the emitter potential functions as a field plate, and therefore it is possible to restrict the focusing of the electrical field at the n-n junction positioned at the boundary 47 and at the p-n junction and the n-n junction positioned farther upward than the boundary 47. Therefore, depletion is encouraged in the RB-IGBT 200 without causing a breakdown.

Figure 4:
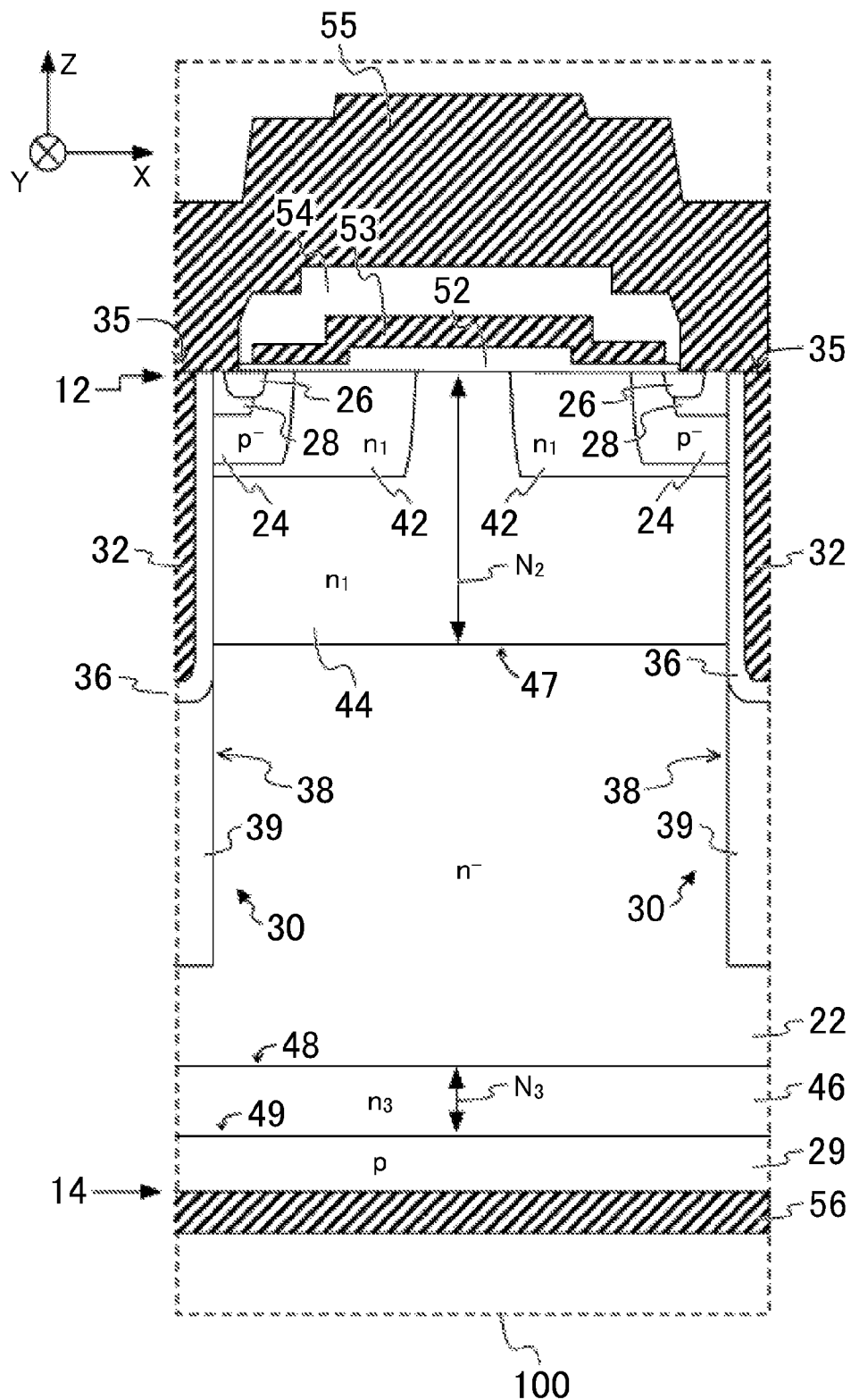
FIG. 4 is a drawing for describing the integrated values $N_2$ and $N_3$ of the n-type impurity concentrations in the $n_2$ region 44 and the $n_3$ region 46.

FIG. 4 is a drawing for describing the integrated values $N_2$ and $N_3$ of the n-type impurity concentrations in the $n_2$ region 44 and the $n_3$ region 46. The n-type impurity concentrations in the $n_2$ region 44 and the $n_3$ region 46 may be changed according to the Z-direction lengths of these regions. For example, the n-type impurity concentration is lower when the Z-direction length is greater, and the n-type impurity concentration is higher when the Z-direction length is smaller. In the present example, the amount of n-type impurities in the $n_2$ region 44 and the $n_3$ region 46 is defined as an integrated value [cm$^{-2}$] obtained by integrating the impurity concentration [cm$^{-3}$] along a straight line parallel to the Z direction.

In the present example, the integrated value $N_2$ of the n-type impurity concentration of the $n_2$ region 44 from the boundary 47 between the $n_2$ region 44 and the $n^-$-type drift region 22 to the front surface 12 of the semiconductor substrate 10 is greater than or equal to 1E+11 cm$^{-2}$ and less than or equal to 5E+11 cm$^2$. Furthermore, the integrated value $N_3$ of the n-type impurity concentration of the $n_3$ region 46 from the boundary 49 between the $n_3$ region 46 and the p-type collector region 29 to the boundary 48 between the $n_3$ region 46 and the n⁻-type drift region 22 is greater than or equal to 3E+11 cm⁻² and less than or equal to 10E+11 cm².

Figure 5:
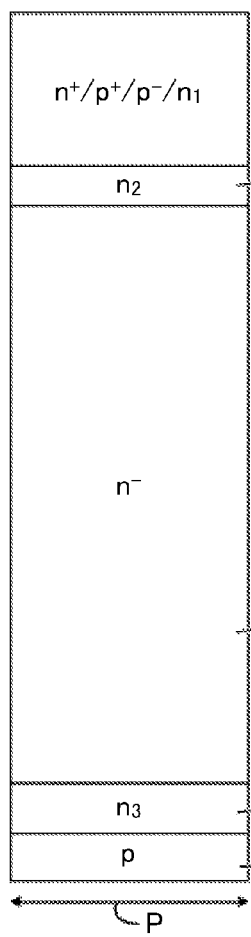
FIG. 5 is a drawing for describing the structural differences between (a) a structure of a first comparative example, (b) a structure of a second comparative example, and (c) a structure of the present example.
Figure 5:
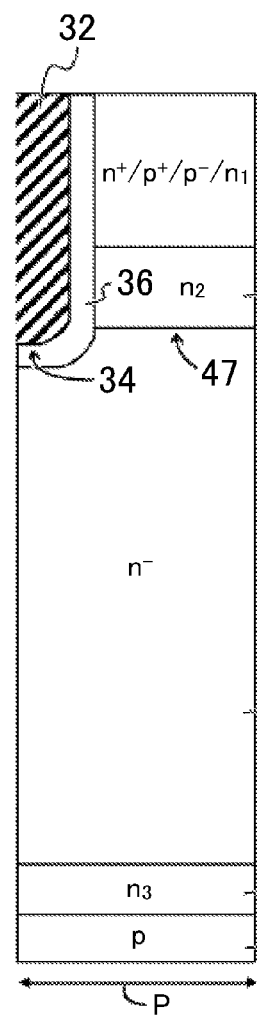
Figure 5:
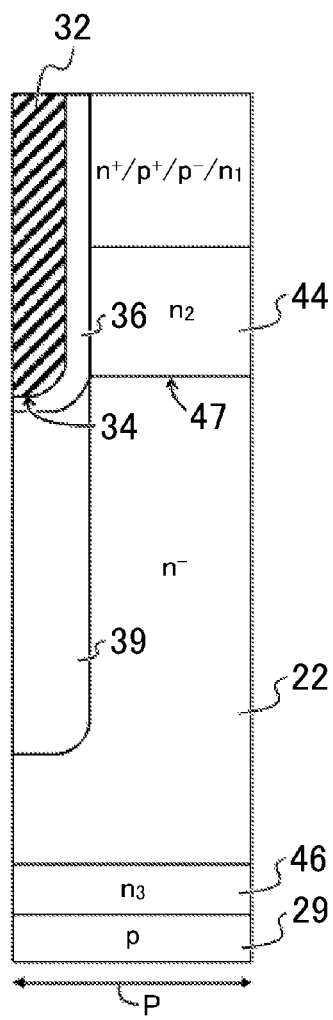

FIG. 5 is a drawing for describing the structural differences between (a) a structure of a first comparative example, (b) a structure of a second comparative example, and (c) a structure of the present example. In FIG. 5, structures (a) to (c) each show a region corresponding to a half-length P in the X direction of the unit structure 100 of the present example. In FIG. 5, structures (a) to (c) each have the same length P. In FIG. 5, structures (a) to (c) each show a view in which the structural portions that are farther upward than the $n_2$ region 44 and farther downward than the p-type collector region 29 are omitted. However, the n⁺-type emitter region 26, the p⁺-type contact region 28, the p⁻-type base region 24, and the $n_1$ region 42 are shown simply near their general positions. These regions are shown in structures (a) to (c) in FIG. 5 as n⁺/p⁺/p⁻/$n_1$.

Each of the structures (a) to (c) in FIG. 5 includes the $n_1$ region 42, the $n_2$ region 44, and the $n_3$ region 46. Structure (a) in FIG. 5 does not include the emitter trench portion 30. Structure (b) in FIG. 5 does not include the lower trench insulating film 39, but does include the upper trench insulating film 36 and the trench electrode 32. The bottom portion 34 of the trench electrode 32 in structure (b) in FIG. 5 is shallower than the bottom portion 34 of the trench electrode 32 in structure (c) in FIG. 5. In other words, the bottom portion 34 of the trench electrode 32 in structure (b) in FIG. 5 is positioned farther in the +Z direction than the bottom portion 34 of the trench electrode 32 in structure (c) in FIG. 5. Accordingly, the boundary 47 of structure (b) in FIG. 5 is shallower than the boundary 47 of structure (c) in FIG. 5.

Figure 6:
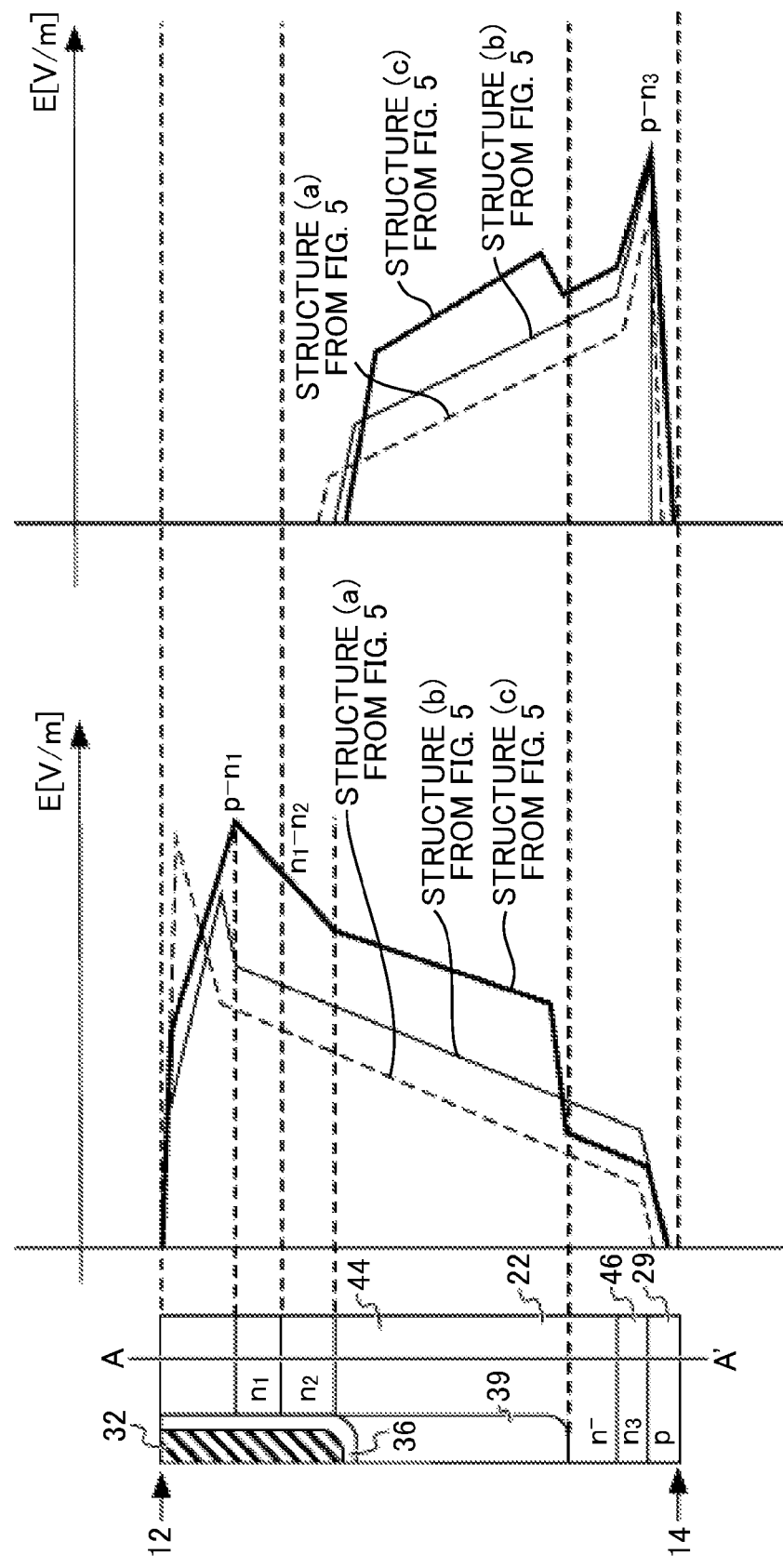
FIG. 6 shows simulation results showing the electrical field strength distribution at breakdown obtained (A) when the forward voltage is applied and (B) when the reverse voltage is applied.

FIG. 6 shows simulation results showing the electrical field strength distribution obtained (A) during a period when the forward voltage is applied and (B) during a period when the reverse voltage is applied. Structure (c) of FIG. 5 is shown on the left side of period (A) in FIG. 6. Each junction position is indicated by a dotted line for reference at A-A' in period (A) in FIG. 6. The characters (a) to (c) in period (A) and period (B) in FIG. 6 correspond to structures (a) to (c) of FIG. 5. The results of structure (a) of FIG. 5 are shown with a dotted line, the results of structure (b) of FIG. 5 are shown with a thin line, and the results of structure (c) of FIG. 5 are shown with a fat line. The vertical axis indicates the position in the thickness direction, and the horizontal axis indicates the electrical field strength.

In periods (A) and (B) in FIG. 6, structure (c) of the present example has greater electrical field strength across almost all of the thickness direction than structure (a) of the first comparative example and structure (b) of the second comparative example. This is because a jump in the electrical field strength occurs at the bottom portion 37 of the emitter trench portion 30.

Figure 7:
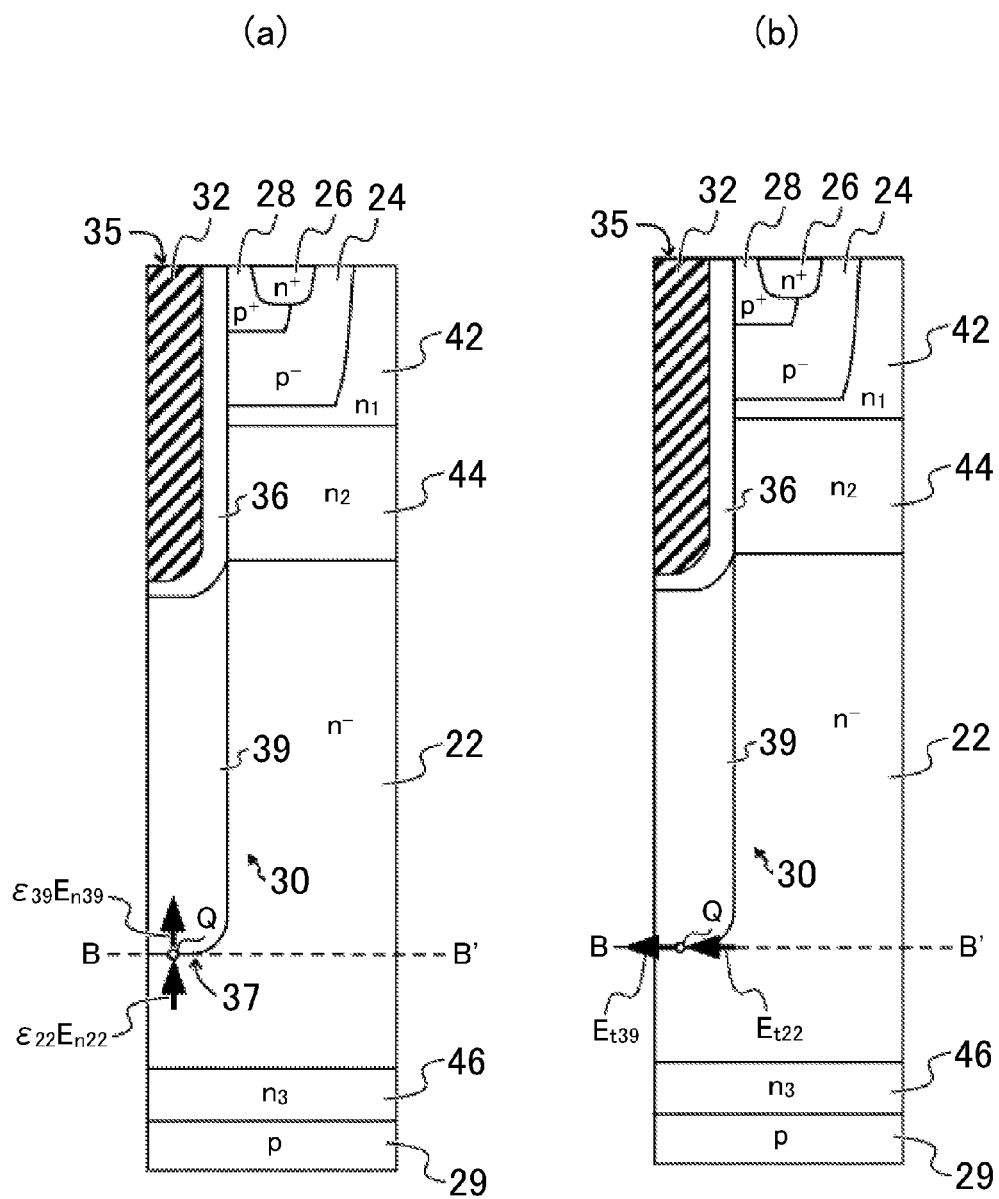
FIG. 7 is a drawing for describing the principle for improving the breakdown voltage using the emitter trench portion 30, in which structure (a) shows the electric flux density in the Z direction at the point Q and structure (b) shows the electrical field in the X direction at the point Q.

FIG. 7 is a drawing for describing the principle for improving the breakdown voltage using the emitter trench portion 30. Structure (a) in FIG. 7 shows the electric flux density in the Z direction at the point Q. Structure (b) in FIG. 7 shows the electrical field in the X direction at the point Q. The point Q is a prescribed position of the bottom portion 37 of the emitter trench portion 30. The B-B' line is a straight lint parallel to the X direction and passing through the point Q.

In structure (a) in FIG. 7, the electrical field component parallel to the Z direction is indicated by $E_n$. The electrical field component parallel to the Z direction in the lower trench insulating film 39 is indicated by $E_{n39}$, and the electrical field component parallel to the Z direction in the n⁻-type drift region 22 is indicated by $E_{n22}$. In structure (b) in FIG. 7, the electrical field component parallel to the X direction is indicated by $E_{t39}$. The electrical field component parallel to the X direction in the lower trench insulating film 39 is indicated by $E_{t39}$, and the electrical field component parallel to the X direction in the n⁻-type drift region 22 is indicated by $E_{t22}$.

As shown by structure (a) in FIG. 7, the electric flux density is continuous at the point Q, and therefore the electric flux density satisfies Expression 1 shown below.

$$\in_{39} \cdot E_{n39} = \in_{22} \cdot E_{n22} \qquad \text{Expression 1:}$$

As shown by structure (b) in FIG. 7, the electrical field is continuous at the point Q, and therefore the electrical field satisfies Expression 2 shown below.

$$E_{t39} = E_{t22} \qquad \text{Expression 2:}$$

At the point Q, $E_{t39}$ is nearly equal to $E_{n39}$. Therefore, Expression 3 shown below can be obtained using Expression 2. In Expression 3, the symbol "≈" means that the values are nearly equal.

$$E_{t39} \approx E_{n39} = E_{t22} \qquad \text{Expression 3:}$$

In the manner described above, in the present embodiment, the dielectric constant $\in_{39}$ of the lower trench insulating film 39 is smaller than the dielectric constant $\in_{22}$ of the n⁻-type drift region 22. In other words, the relationship shown by Expression 4 is satisfied.

$$\in_{39} < \in_{22} \qquad \text{Expression 4:}$$

Expression 5 can be obtained from Expressions 1, 3, and 4.

$$\in_{39}/\in_{22} = E_{n22}/E_{n39} = E_{n22}/E_{t22} < 1 \qquad \text{Expression 5:}$$

In other words, it is possible to reach the conclusion the $E_{22} < E_{t22}$ at the point Q. Therefore, at the B-B' line, the electrical field strength distribution becomes non-continuous. Specifically, the electrical field strength of the n⁻-type drift region 22 is raised above the B-B' line. This causes the jump in the electrical field strength distribution.

Figure 8:
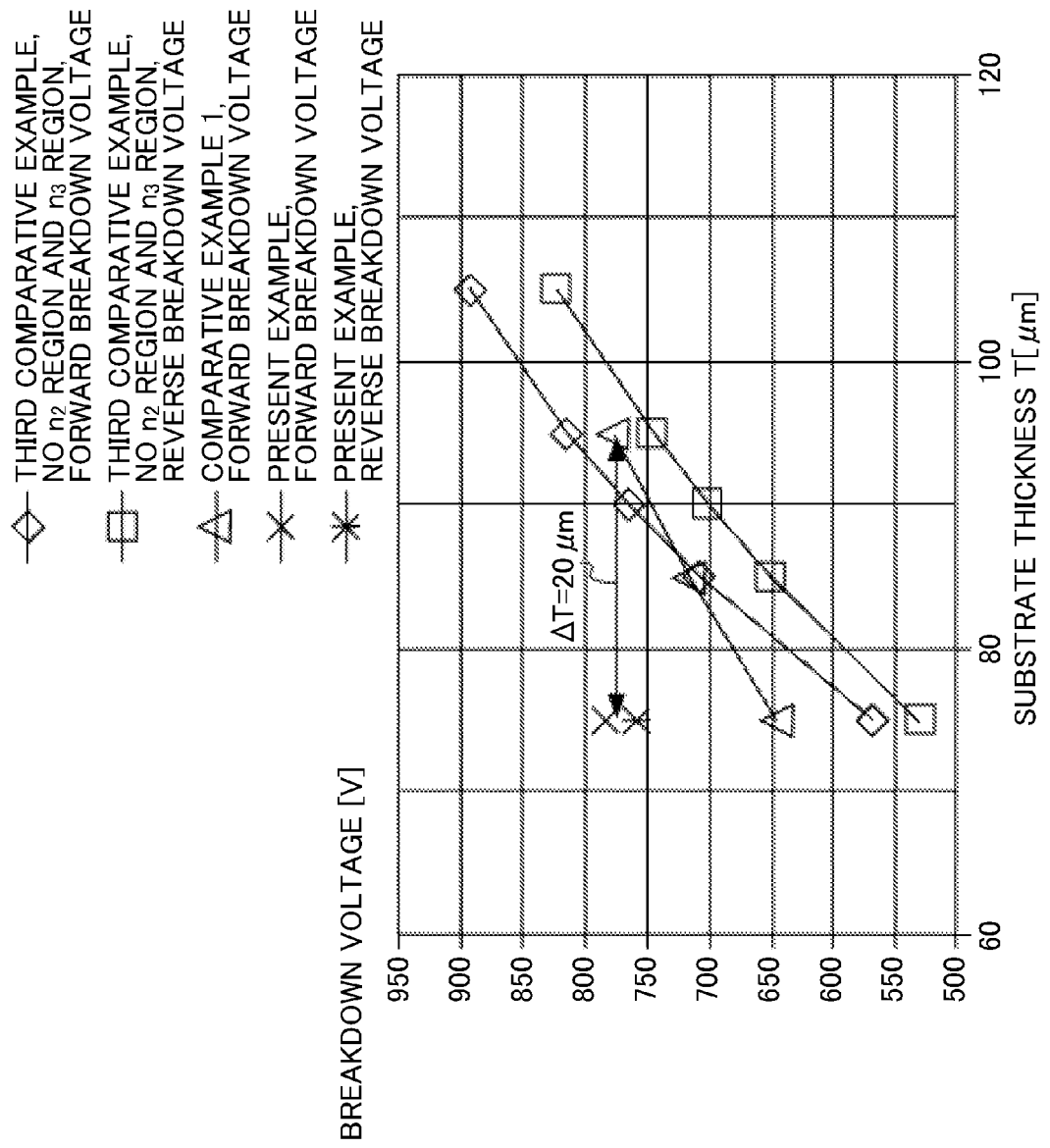
FIG. 8 shows the relationship between the substrate thickness and the breakdown voltage at room temperature.

FIG. 8 shows the relationship between the substrate thickness and the breakdown voltage at room temperature. The horizontal axis indicates the substrate thickness. The length from the front surface 12 to the back surface 14 of the semiconductor substrate 10 in the present example corresponds to the substrate thickness. The vertical axis indicates the breakdown voltage (breakdown voltage).

Simulation results obtained for structure (a) of the first comparative example in FIG. 5 when a forward voltage is applied are shown with triangular marks. A third comparative example is formed with a structure obtained by removing the $n_2$ region 44 and the $n_3$ region 46 from the first comparative example. Simulation results of the breakdown voltage obtained for the third comparative example when a forward voltage is applied are shown with diamond-shaped marks. Simulation results of the breakdown voltage obtained for the third comparative example when a reverse voltage is applied are shown with square marks. Furthermore, simulation results of the breakdown voltage obtained for the present example when a forward voltage is applied are shown with X marks, and simulation results of the breakdown voltage obtained for the present example when a reverse voltage is applied are shown with symbols that are combinations of an X mark and a vertical line.

(The n⁻-Type Drift Region 22)

In the third comparative example, the n-type impurity concentration of the n⁻-type drift region 22 was set to 1.62E+14 [cm$^{-3}$]. Here, E indicates 10 raised to a certain power, such that 1E+16 means 1×10$^{16}$, for example. In the present example and the first comparative example, the n-type impurity concentration of the n$^-$-type drift region 22 was set to 8.96E+13 [cm$^{-3}$].

(The p$^-$-Type Base Region 24)

In the third comparative example, the junction depth of the p$^-$-type base region 24 was set to approximately 9.6 [μm]. The junction depth refers to the length from the front surface 12 to the depth-direction bottom end of the p$^-$-type base region 24. In the first comparative example, the junction depth of the p$^-$-type base region 24 was set to approximately 8.6 [μm]. In the present example, the junction depth of the p$^-$-type base region 24 was set approximately from 2.5 [μm] to 4.0 [μm].

(The p-Type Collector Region 29)

In the third comparative example, the first comparative example, and the present example, the junction length from the back surface 14 of the p-type collector region 29 was set approximately from 0.4 [μm] to 0.8 [μm].

(The Upper Trench Insulating Film 36 and the Lower Trench Insulating Film 39)

The upper trench insulating film 36 and the lower trench insulating film 39 in the present example were silicon oxide films. The dielectric constant of silicon oxide is approximately 4.

(The n$_2$ Region 44)

In the first comparative example and the present example, the n-type impurity distribution of the n$_2$ region 44 is a Gaussian distribution having a maximum value for the n-type impurities at a central position in the depth direction. The central position in the depth direction of the n$_2$ region 44 is a position shifted in the +Z direction by a half-length of the Z-direction length of the n$_2$ region 44 from the boundary 47 in the structure (c) of FIG. 5. The standard deviation a of this Gaussian distribution was set to 1 [μm]. The n-type impurity dose concentration used when forming the n$_2$ region 44 was set to 3E+11 [cm$^{-2}$].

(The n$_3$ Region 46)

In the first comparative example and the present example, the n-type impurity distribution of the n$_3$ region 46 is a Gaussian distribution having a maximum value for the n-type impurities at a central position in the depth direction. The central position in the depth direction of the n$_3$ region 46 is a position shifted in the +Z direction by a half-length of the Z-direction length of the n$_3$ region 46 from the back surface 14 in the structure (c) of FIG. 5.

In the first comparative example and the present example, the central position in the depth direction of the n$_3$ region 46 was set to 1 [μm] from the back surface 14. The standard deviation a of the Gaussian distribution of the first comparative example was set to 2 [μm]. In contrast to this, the standard deviation a of the Gaussian distribution of the present example was set to 3 [μm]. In the first comparative example, the n-type impurity dose concentration used when forming the n$_3$ region 46 was set to 5E+11 [cm$^{-2}$]. In contrast to this, in the present example, the n-type impurity dose concentration used when forming the n$_3$ region 46 was set to 8E+11 [cm$^{-2}$]. The various values for the n$_1$ region 42, the n$_2$ region 44, and the n$_3$ region 46 were optimal values selected to achieve the greatest breakdown voltage in each example.

In the present example, the forward breakdown voltage was 782 [V] and the reverse breakdown voltage was 758 [V]. As shown in FIG. 8, in a case where the present example and the first comparative example are set to the same breakdown voltage, the semiconductor substrate 10 of the present example can be made approximately 20 [μm] thinner than in the first comparative example. Furthermore, in a case where the present example and the third comparative example are set to the same breakdown voltage, the semiconductor substrate 10 of the present example can be made approximately 15 [μm] to approximately 20 [μm] thinner than in the third comparative example.

Figure 9A:
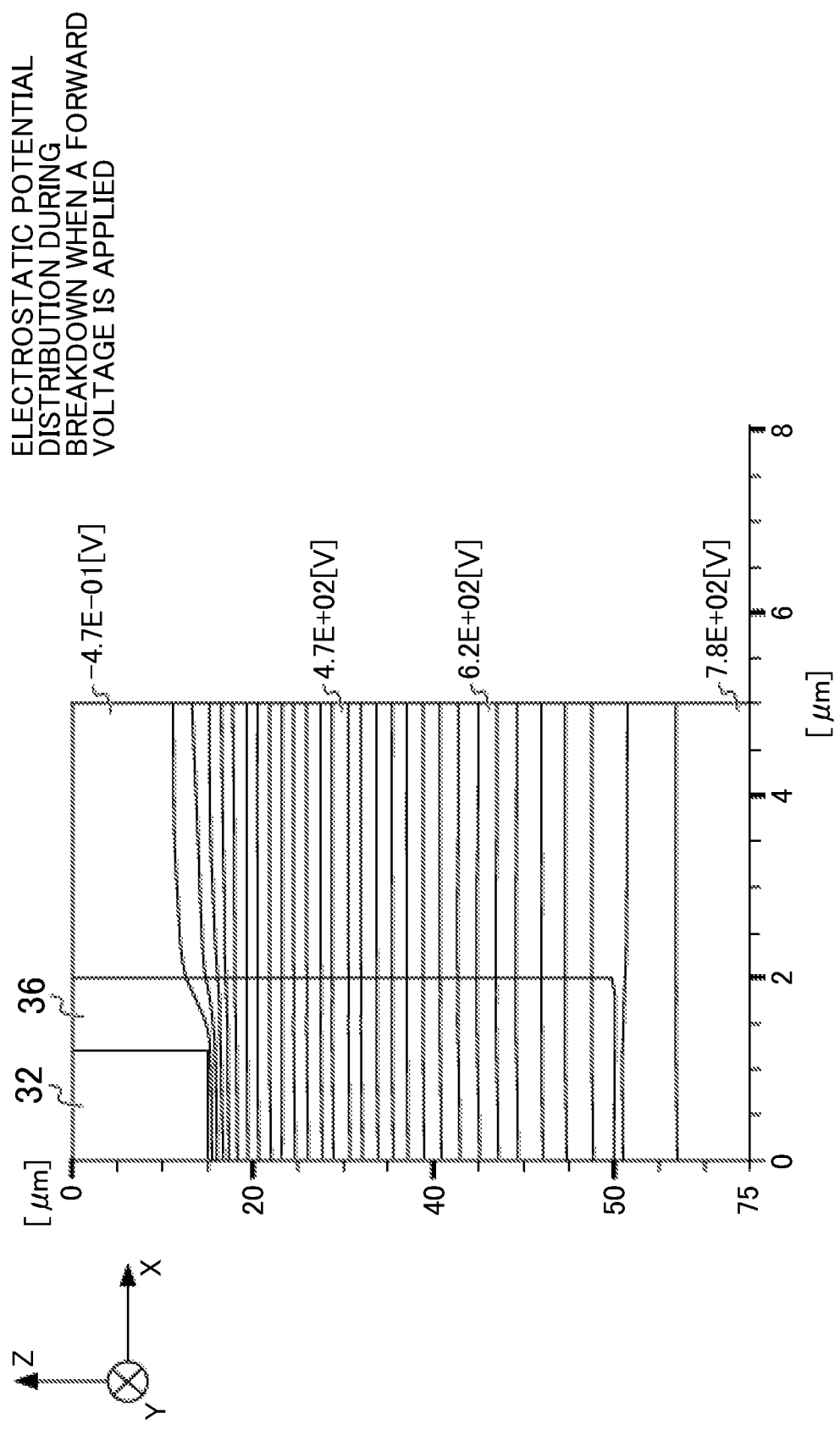
FIG. 9A shows the electrostatic potential distribution during breakdown when the forward voltage is applied in FIG. 8.
Figure 9B:
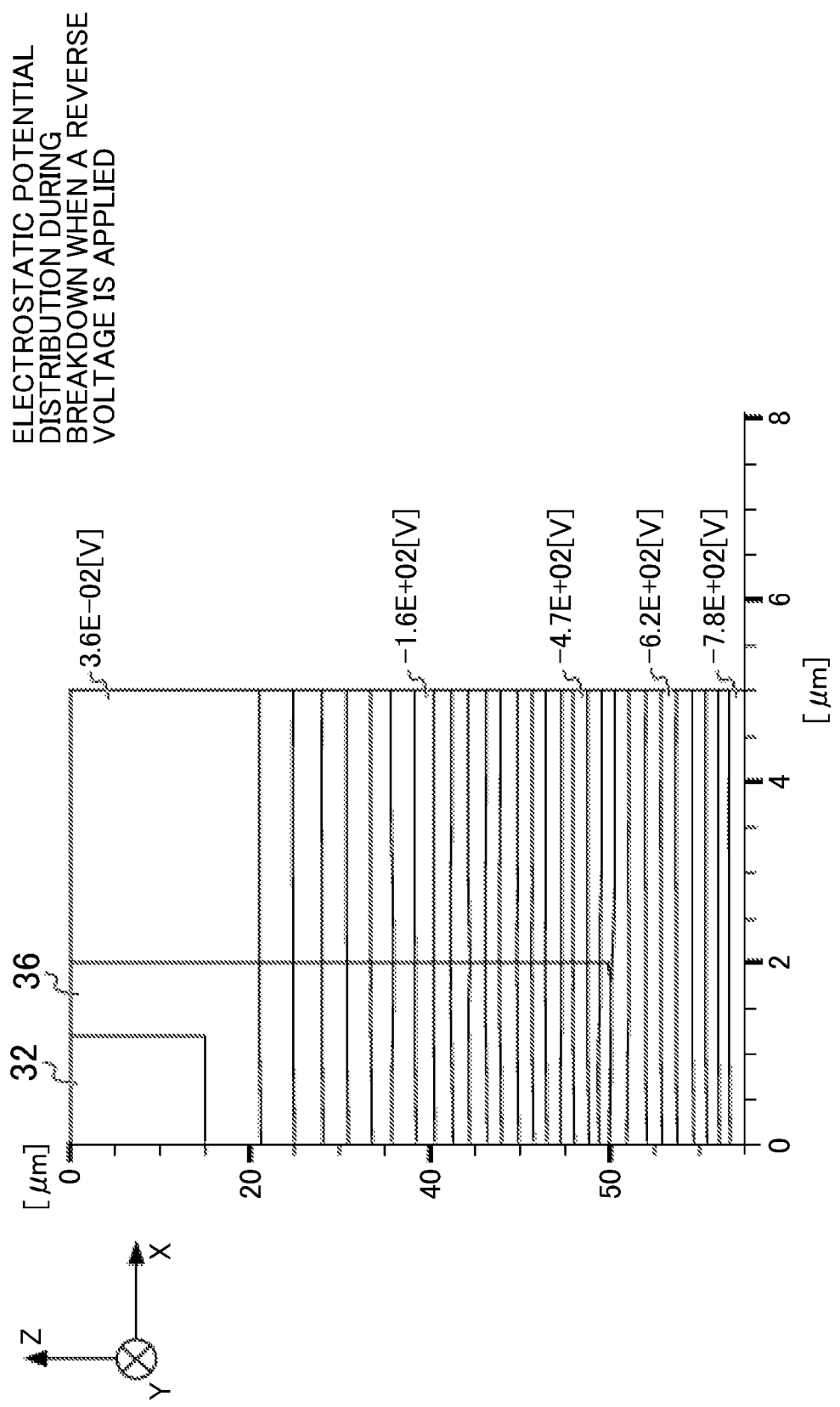
FIG. 9B shows the electrostatic potential distribution during breakdown when the reverse voltage is applied in FIG. 8.

FIG. 9A shows the electrostatic potential distribution during breakdown when the forward voltage is applied in FIG. 8. FIG. 9B shows the electrostatic potential distribution during breakdown when the reverse voltage is applied in FIG. 8. The structures used for FIGS. 9A and 9B match the structure shown in FIG. 3. The electrical field strength distribution in the Z direction at a position between X=2 [μm] and X=5 [μm] in FIGS. 9A and 9B correspond respectively to the distributions in FIG. 6.

FIGS. 10A to 10H shows a manufacturing method of the RB-IGBT 200. In this manufacturing method, each stage is performed in order from FIG. 10A to FIG. 10H.

Figure 10A:
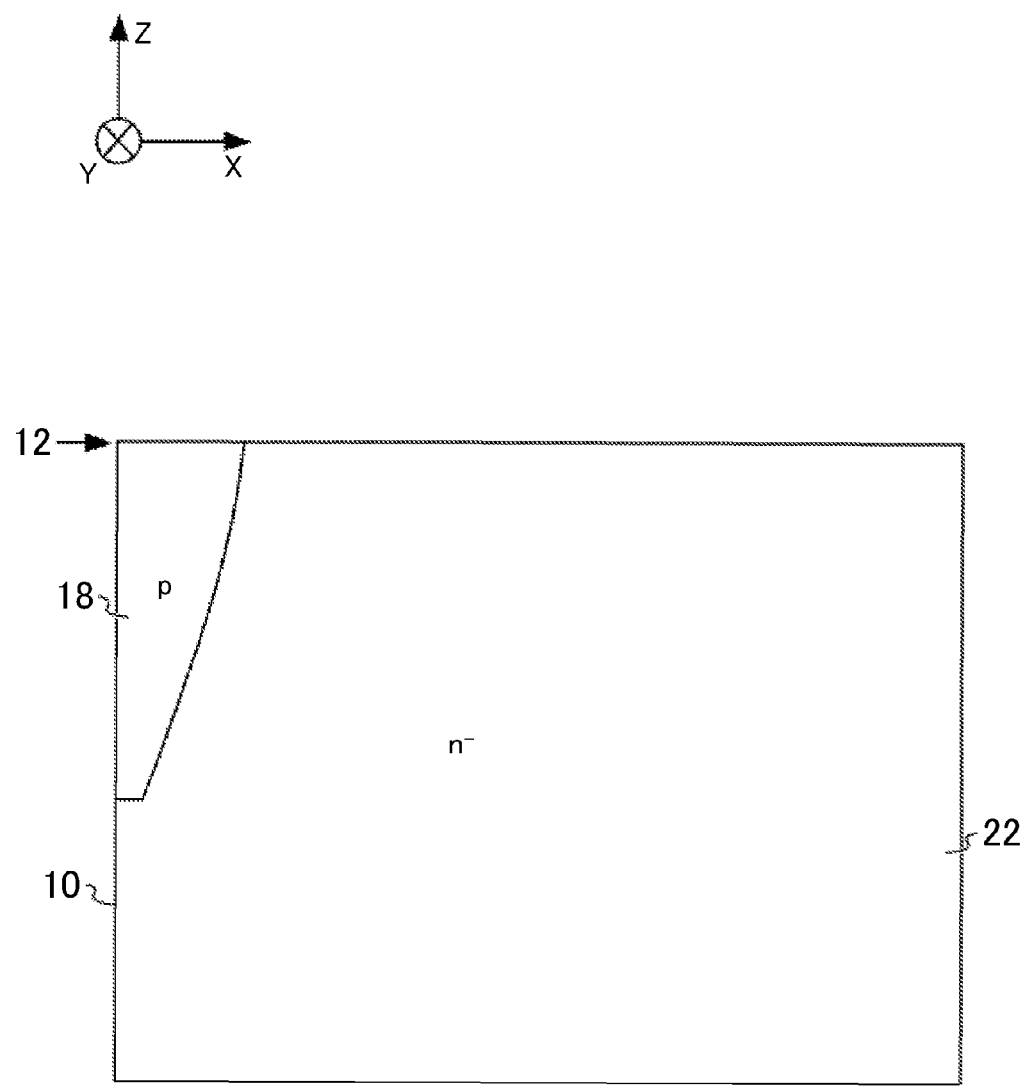
FIG. 10A shows a diagram up to the stage of manufacturing the p-type isolation region 18.

FIG. 10A shows a diagram up to the stage of manufacturing the p-type isolation region 18. The semiconductor substrate 10 in the present example is an n-type silicon substrate formed using an FZ (Floating Zone) technique. First, p-type impurities are locally injected from the front surface 12 of the semiconductor substrate 10. After this, the p-type isolation region 18 is formed by thermally diffusing the p-type impurities. After this, the oxide film formed on the entire front surface 12 is removed.

Figure 10B:
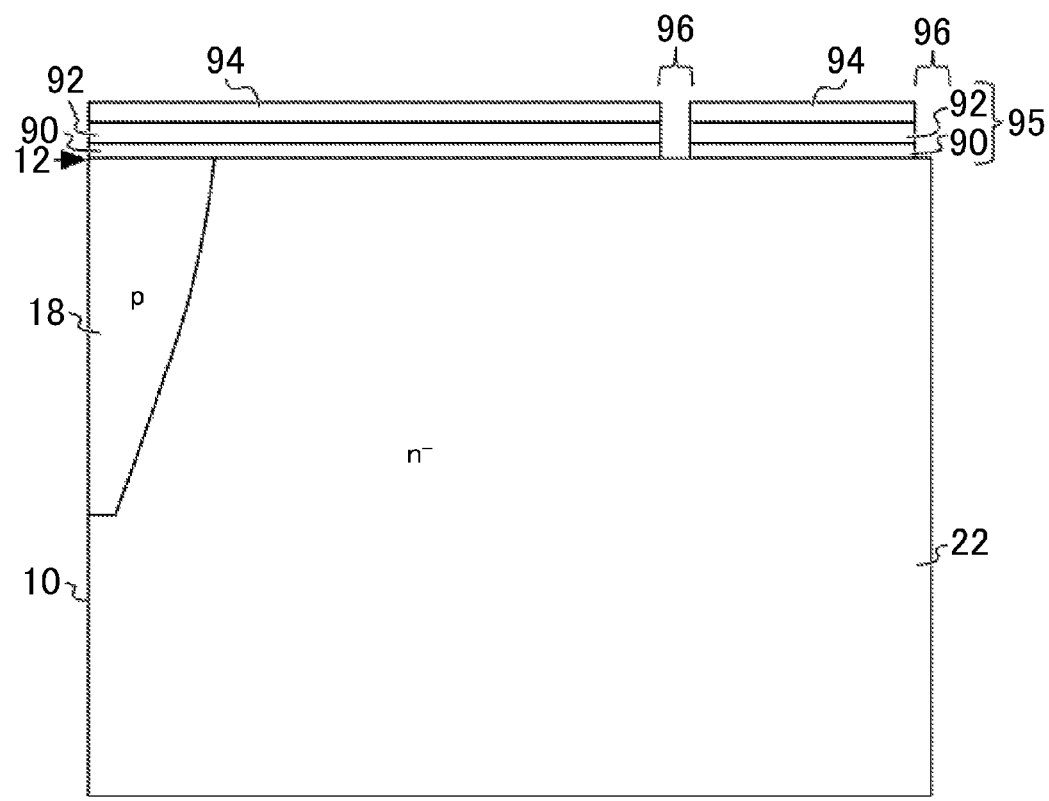
FIG. 10B shows a diagram up to the stage of forming openings 96 in a mask 95 for forming the emitter trench portion 30.

FIG. 10B shows a diagram up to the stage of forming openings 96 in a mask 95 for forming the emitter trench portion 30. The mask 95 includes a polysilicon layer 90 with a thickness of 0.3 [μm], a silicon oxide layer 92 with a thickness of 0.5 [μm], and a polysilicon layer 90 with a thickness of 0.3 [μm]. The openings 96 are formed by patterning the mask 95 on the photoresist layer 94. In the present example, each opening 96 has a width of 4 [μm] in the X direction.

Figure 10C:
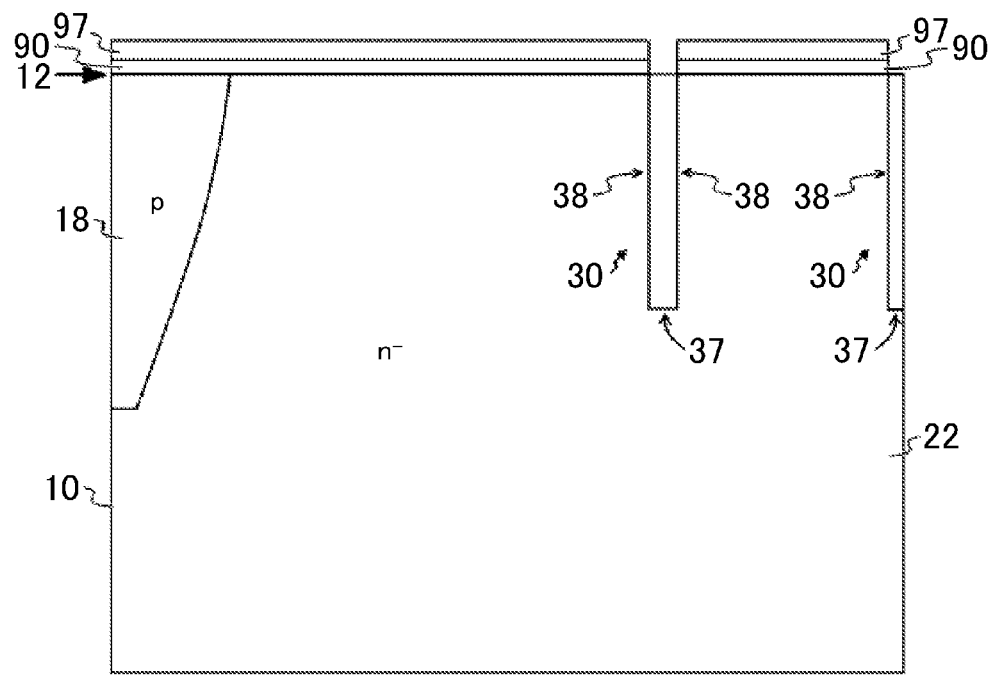
FIG. 10C shows a diagram up to the stage of forming the emitter trench portion 30 using etching.

FIG. 10C shows a diagram up to the stage of forming the emitter trench portion 30 using etching. The semiconductor substrate 10 is etched through the mask 95 using reactive ion etching (RIE). In this way, the front surface 12 exposed in the openings 96 is etched. In the present example, the semiconductor substrate 10 is etched by 60 [μm] in the −Z direction from the front surface 12. In this way, the emitter trench portion 30 having the bottom portion 37 and the side portions 38 is formed. After this, thermal oxidization is performed to form the thermal oxide film with a thickness of 100 [nm] on top of the silicon oxide layer 92. The silicon oxide layer 92 and the thermal oxide film are shown by the sacrificial oxidation layer 97.

Figure 10D:
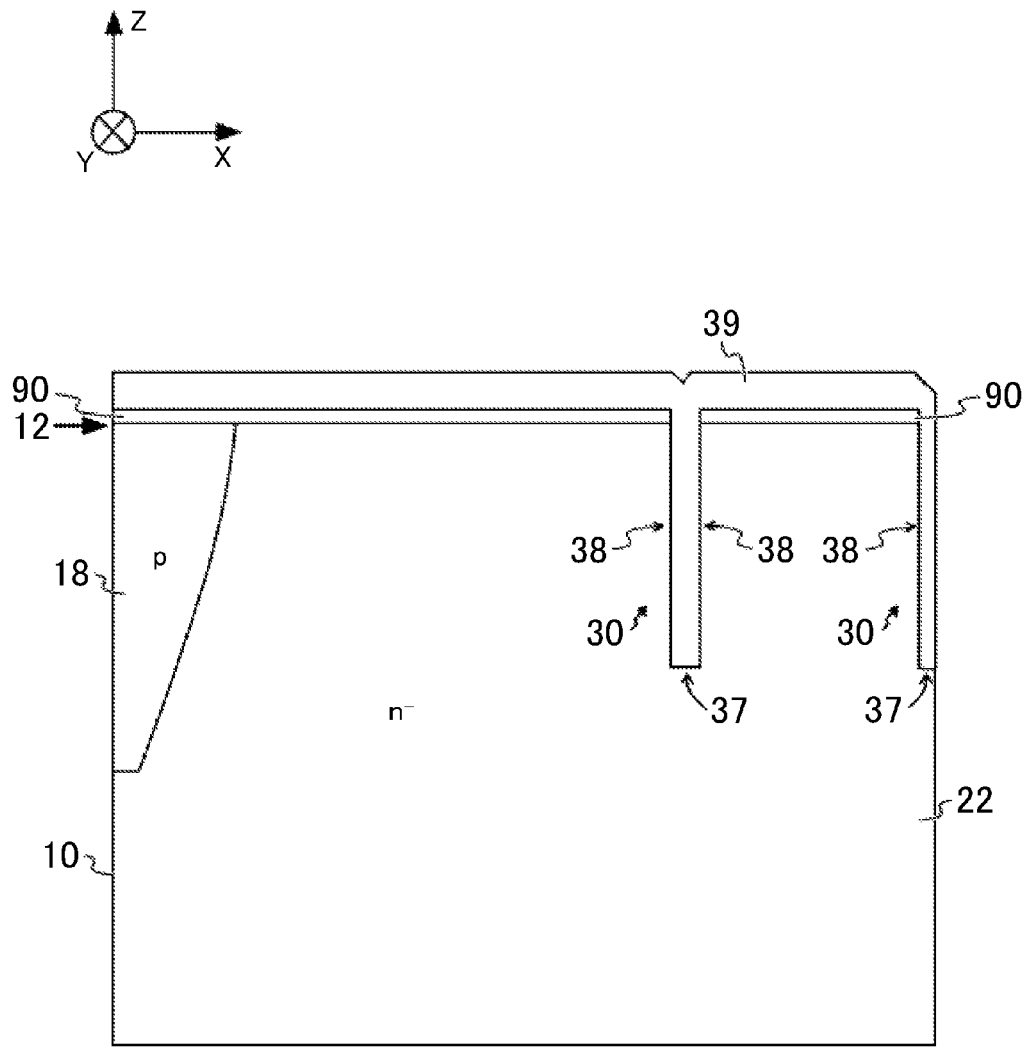
FIG. 10D shows a diagram up to the stage of forming the lower trench insulating film 39.

FIG. 10D shows a diagram up to the stage of forming the lower trench insulating film 39. After the sacrificial oxidation layer 97 has been removed, the lower trench insulating film 39 is deposited form the front surface 12 side. The lower trench insulating film 39 may be a CVD oxide film or a SOG film, as described above. The lower trench insulating film 39 is deposited in the emitter trench portion 30 and on top of the polysilicon layer 90.

Figure 10E:
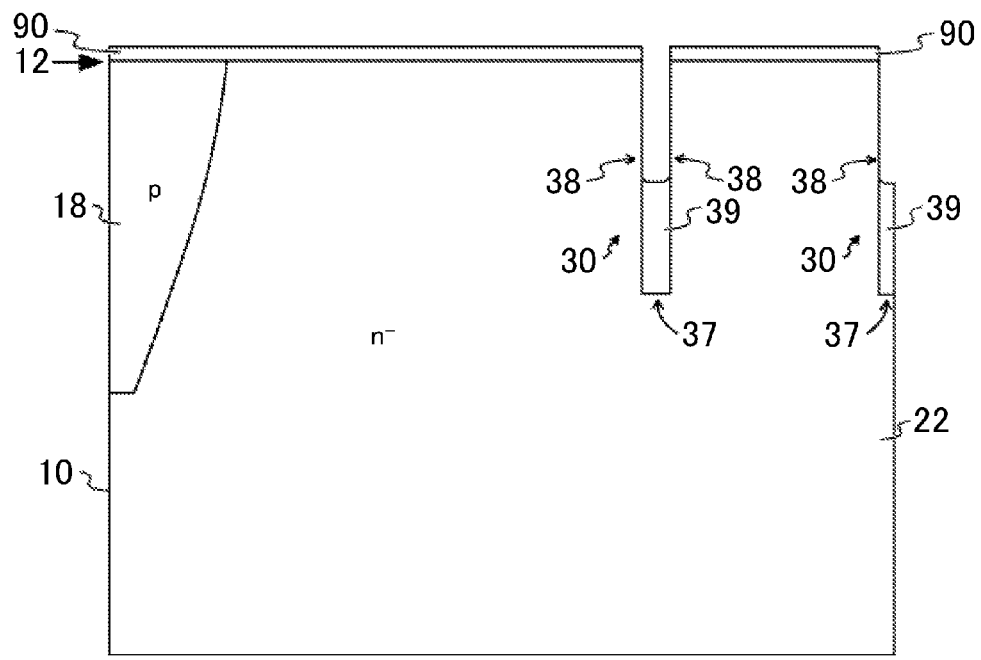
FIG. 10E shows a diagram up to the stage of partially removing the lower trench insulating film 39.

FIG. 10E shows a diagram up to the stage of partially removing the lower trench insulating film 39. This removal may be realized using anisotropic etching such as RIE, or may be realized using isotropic etching such as wet etching. In this way, only the lower trench insulating film 39 is selectively removed from the polysilicon layer 90 and the semiconductor substrate 10. The lower trench insulating film 39 is not entirely removed, and a prescribed length of the lower trench insulating film 39 in the Z direction from the bottom portion 37 remains.

Figure 10F:
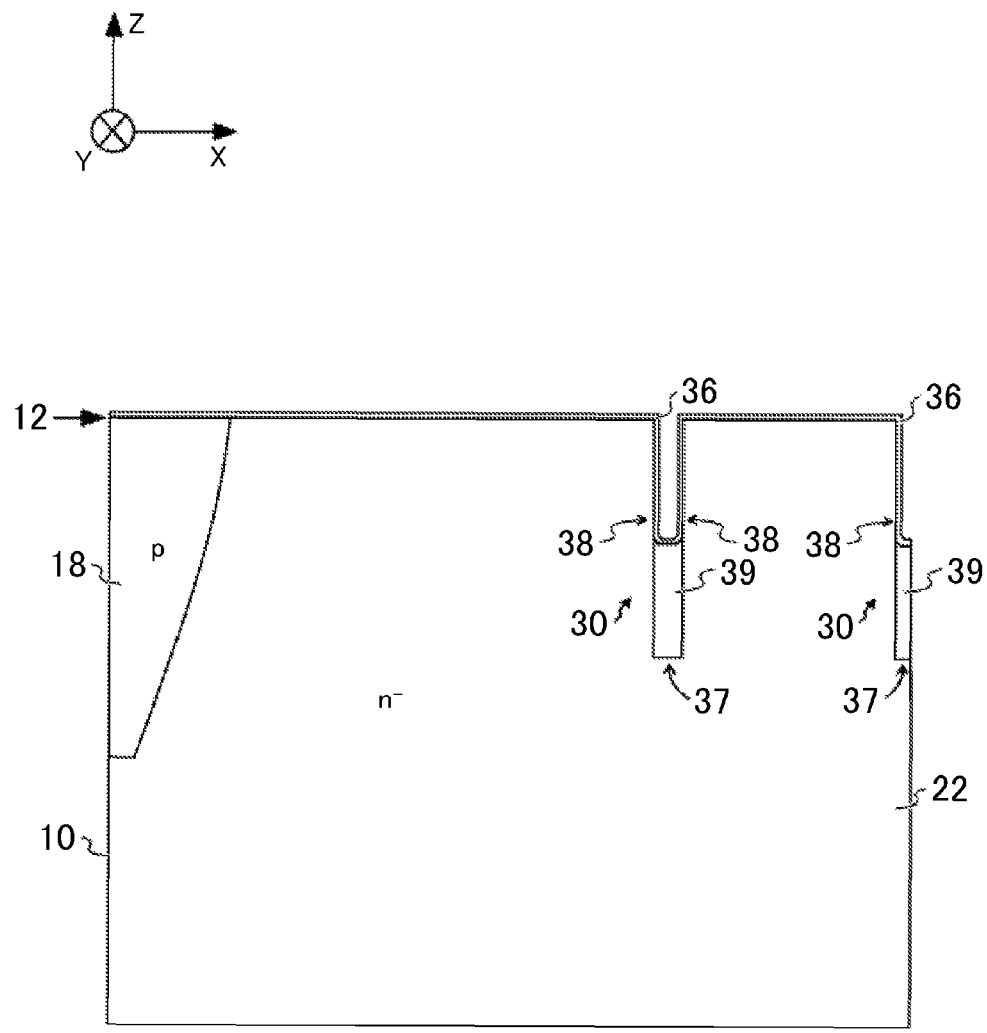
FIG. 10F shows a diagram up to the stage of forming the upper trench insulating film 36.

FIG. 10F shows a stage of forming the upper trench insulating film 36. First, the polysilicon layer 90 remaining from the stage shown in FIG. 10E is completely oxidized, and then this portion is selectively removed. After this, the thermal oxide film is formed on the front surface 12, the top surface of the lower trench insulating film 39, which corresponds to the bottom portion 34 of the trench electrode 32, and the side portions 38 farther upward than the lower trench insulating film 39. This thermal oxide film may have a thickness from 30 [nm] to 100 [nm].

After this, an additional oxide film with a thickness from 0.5 [μm] to 1.5 [μm] is formed on top of the thermal oxide film. This additional oxide film may be an oxide film obtained from a reaction between TEOS (Tetra Ethyl Ortho Silicate) and oxygen or ozone, or may be an HTO (High Temperature Oxide) film using dichlorosilane and nitrous oxide as materials. The upper trench insulating film 36 is formed by the thermal oxide film and the additional oxide film.

Figure 10G:
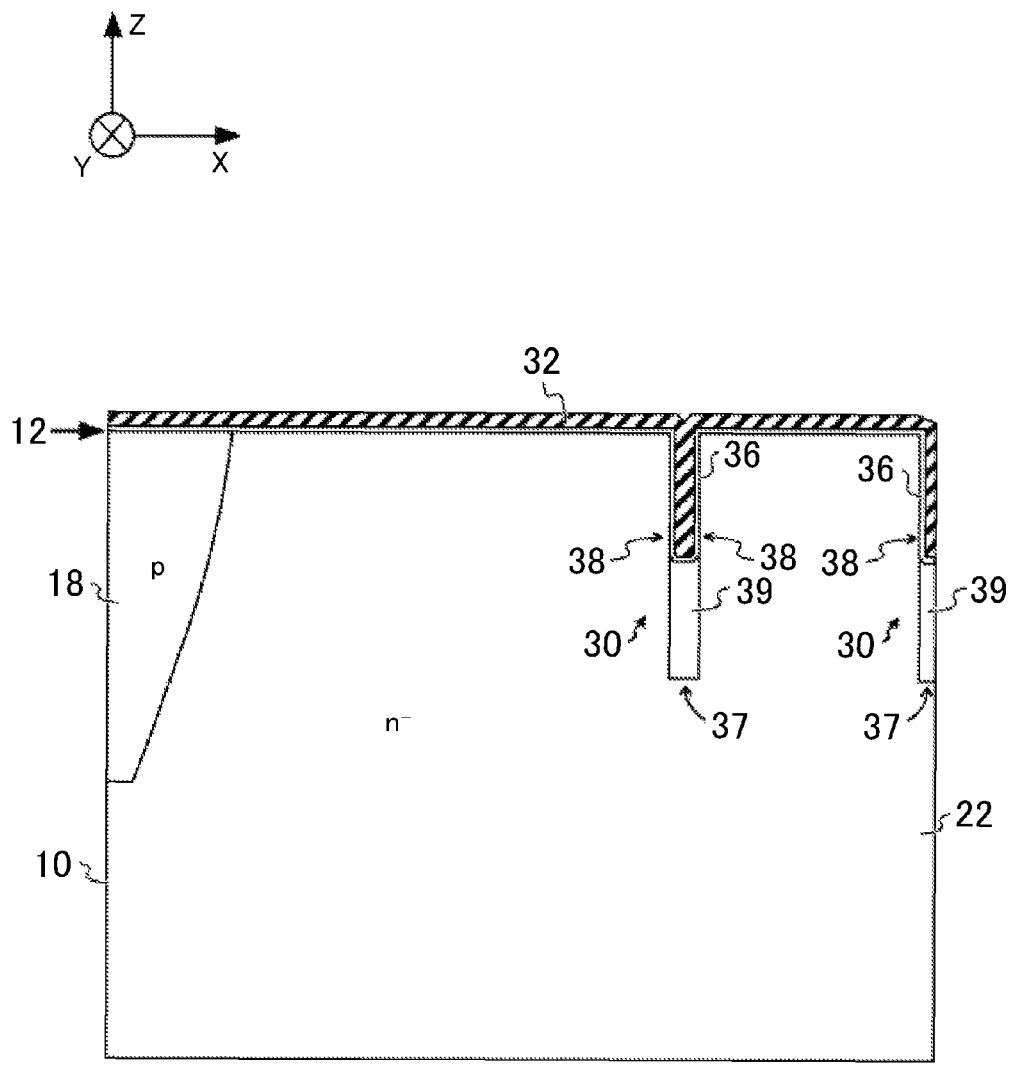
FIG. 10G shows a diagram up to the stage of depositing the trench electrode 32.

FIG. 10G shows a diagram up to the stage of depositing the trench electrode 32. The trench electrode 32 may be a polysilicon electrode. The trench electrode 32 is deposited in the emitter trench portion 30 as well as on top of the front surface 12.

Figure 10H:
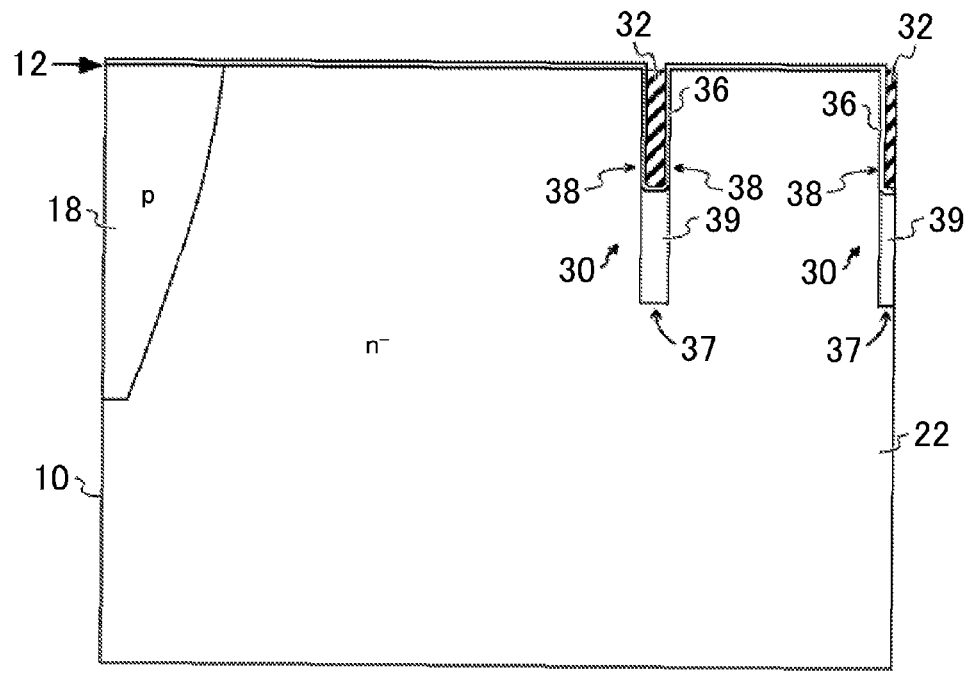
FIG. 10H shows a diagram up to the stage of partially removing the trench electrode 32.

FIG. 10H shows a diagram up to the stage of partially removing the trench electrode 32. In this way, only the trench electrode 32 positioned farther upward than the front surface 12 is selectively removed. After this, a thermal oxide film is formed on the front surface 12. The following stages can be performed using known IGBT formation stages, and therefore are broadly explained.

First, the structures on the front surface 12 side are formed. First, in the active region 82, the $n_2$ region 44, the $n_1$ region 42, the $p^-$-type base region 24, the $p^+$-type contact region 28, and the $n^+$-type emitter region 26 are formed. At this time, in the termination region 84, the $p^+$-type region 62 and the $p^-$-type region 64 may also be formed. The n-type impurities may be boron (B). The p-type impurities may be arsenic (As) or phosphorous (P). After the impurity injection, suitable thermal processing is performed.

Next, in the active region 82, the gate insulating film 52, the gate electrode 53, and the interlayer insulating film 54 are formed. At this time, in the termination region 84, the polysilicon field plate 68, the first interlayer insulating film 72, and the second interlayer insulating film 74 may also be formed. As described above, the interlayer insulating film 54, the first interlayer insulating film 72, and the second interlayer insulating film 74 may be silicon oxide. After this, the emitter electrode 55 is formed in the active region 82 and the metal field plate 78 is formed in the termination region 84. The emitter electrode 55 and the metal field plate 78 may be an aluminum and silicon alloy (Al—Si).

After this, the back surface 14 is ground such that the thickness of the semiconductor substrate 10 becomes a thickness corresponding to the desired breakdown voltage. In the present example, this thickness was 75 [μm]. After this, the structures on the back surface 14 side are formed. First, the $n_3$ region 46 is formed. The n-type impurities in the $n_3$ region 46 may be protons (H$^+$). Next, the p-type collector region 29 is formed. The p-type impurities in the p-type collector region 29 may be phosphorous (P). After this, the collector electrode 56 is formed. The collector electrode 56 may be formed by layering titanium (Ti), nickel (Ni), and gold (Au) in the stated order in the −Z direction. In this way, the RB-IGBT 200 is completed.

Figure 11:
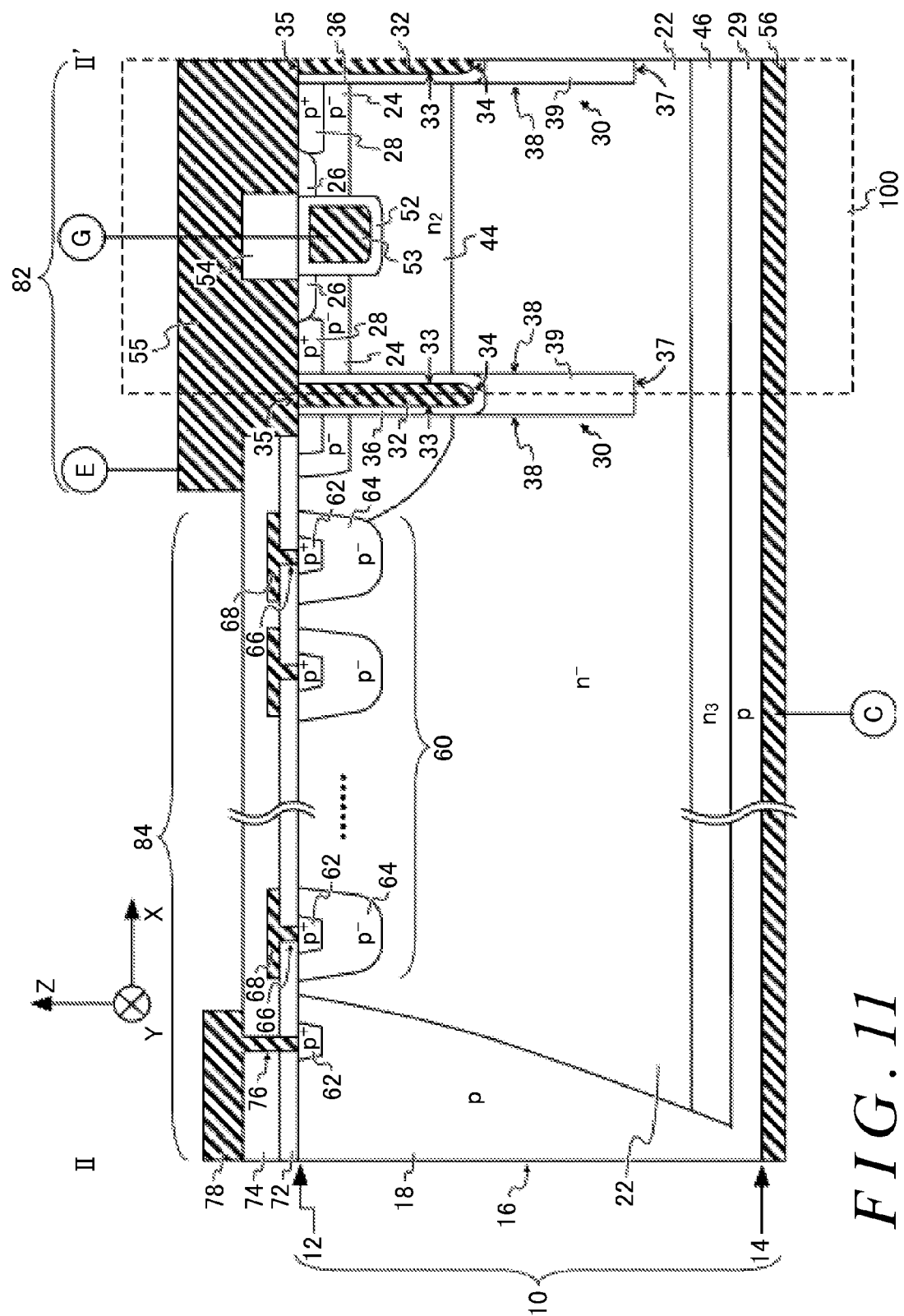
FIG. 11 shows another example of the II-II' cross section.

FIG. 11 shows another example of the II-II' cross section. The present example includes the gate insulating film 52 and the gate electrode 53 shaped as trenches. Furthermore, in the present example, the $n_1$ region 42 is not provided. These points are the main differences between the present example and the example of FIG. 2. The bottommost portion of the gate insulating film 52 in the present example is positioned farther downward than the $p^-$-type base region 24 and farther upward than the bottommost portion of the $n_2$ region 44. It is obvious that the RB-IGBT 200 may have the cross-sectional shape shown in FIG. 11. In this case, the gate insulating film 52 and the gate electrode 53 are provided in the semiconductor substrate 10, in the same manner as the emitter trench portion 30.

Figure 12:
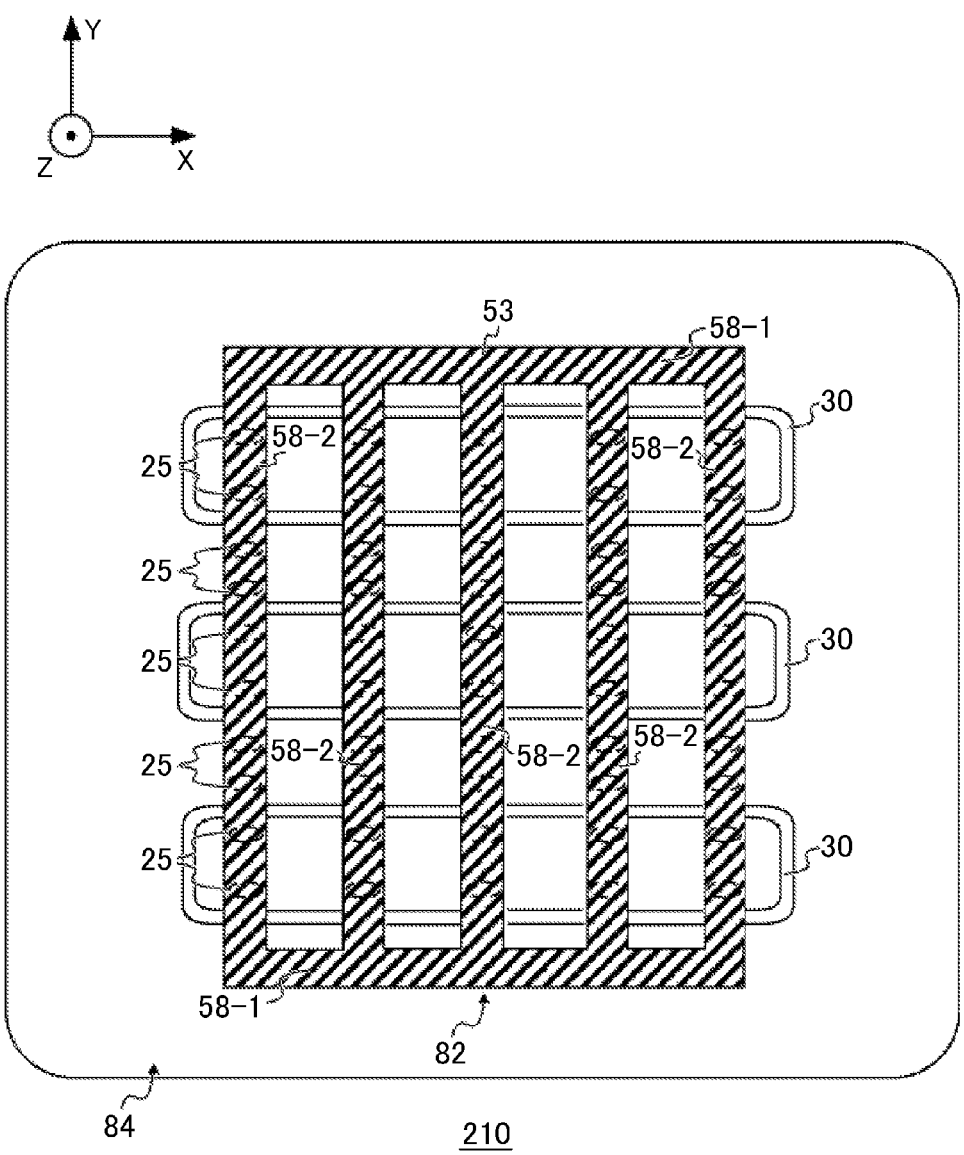
FIG. 12 is a schematic overhead view of an RB-IGBT 210 according to a second embodiment.

FIG. 12 is a schematic overhead view of an RB-IGBT 210 according to a second embodiment. The emitter trench portion 30 in the present example is also provided as a ring shape when seen in the overhead view. This point is the same as in the example shown in FIG. 1. However, the emitter trench portion 30 in the present example is provided in a manner to sandwich a channel formation region 25 in the Y direction. The long portions of the ring shape of the emitter trench portion 30 are parallel to the X direction. The second embodiment differs from the example shown in FIG. 1 with respect to this point. It is obvious that the RB-IGBT 210 may have the cross-sectional shapes shown in FIGS. 2 and 11.

In the present example as well, the channel formation regions 25 are positioned directly below the linear portions 58-2 extending in the Y direction. In the same manner as in FIG. 1, the channel formation regions 25 are shown by dotted lines. In the present example as well, in an overhead view of the front surface 12 of the semiconductor substrate 10, each emitter trench portion 30 has a ring shape. In the overhead view, each emitter trench portion 30 is provided in a manner to sandwich at least one channel formation region 25 in the X direction. Each emitter trench portion 30 in the present example is provided in a manner to surround two channel formation regions 25 in the Y direction.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

LIST OF REFERENCE NUMERALS

10: semiconductor substrate, 12: front surface, 14: back surface, 16: side surface, 18: p-type isolation region, 22: $n^-$-type drift region, 24: $p^-$-type base region, 25: channel formation region, 26: $n^+$-type emitter region, 28: $p^+$-type contact region, 29: p-type collector region, 30: emitter trench portion, 32: trench electrode, 33: side portion, 34: bottom portion, 35: peak portion, 36: upper trench insulating film, 37: bottom portion, 38: side portion, 39: lower trench insulating film, 42: $n_1$ region, 44: $n_2$ region, 46: $n_3$ region, 47: boundary, 48: boundary, 49: boundary, 52: gate insulating film, 53: gate electrode, 54: interlayer insulating film, 55: emitter electrode, 56: collector electrode, 58: linear portion, 60: field limiting ring, 62: $p^+$-type region, 64: $p^-$-type region, 66: via, 68: polysilicon field plate, 72: first interlayer insulating film, 74: second interlayer insulating film, 76: via, 78: metal field plate, 82: active region, 84: termination region, 90: polysilicon layer, 92: silicon oxide layer, 94: photoresist layer, 95: mask, 96: opening, 97: sacrificial oxidation layer, 100: unit structure, 200: RB-IGBT, 210: RB-IGBT

What is claimed is:

1. An RB-IGBT including an isolation region having a first conductivity type on a side surface of a semiconductor substrate, wherein
the semiconductor substrate includes:
a drift region having a second conductivity type;
a collector region having the first conductivity type and provided farther downward than the drift region; and
an emitter trench portion provided extending to the drift region in a thickness direction that is from a front surface of the semiconductor substrate to a back surface of the semiconductor substrate, and
the emitter trench portion includes:
an upper portion filled by a trench electrode that is electrically connected to an emitter electrode provided above the semiconductor substrate and an upper trench insulating film that directly contacts a bottom portion and side portions of the trench electrode; and
a lower portion entirely filled by a lower trench insulating film provided below the upper trench insulating film.

2. The RB-IGBT according to claim 1, wherein
the lower trench insulating film has a dielectric constant that is lower than a dielectric constant of a semiconductor material of the drift region.

3. The RB-IGBT according to claim 2, wherein
the dielectric constant of the lower trench insulating film is less than 12.

4. The RB-IGBT according to claim 1, wherein
a length of the trench electrode from a peak portion thereof to a bottom portion thereof is greater than or equal to 10 μm and less than or equal to 20 μm, and
a length from the bottom portion of the trench electrode to a bottom portion of the lower trench insulating film is greater than or equal to 40 μm and less than or equal to 50 μm.

5. The RB-IGBT according to claim 1, wherein
a bottom portion of the emitter trench portion is separated from the back surface of the semiconductor substrate by a distance that is greater than or equal to 10 μm and less than or equal to 20 μm.

6. The RB-IGBT according to claim 1, further comprising:
a second semiconductor region that is provided on top of the drift region and has an impurity concentration of impurities having the second conductivity type that is higher than an impurity concentration of impurities having the second conductivity type of the drift region, wherein
the second semiconductor region is adjacent to the upper trench insulating film in a direction orthogonal to the thickness direction of the semiconductor substrate.

7. The RB-IGBT according to claim 6, wherein
a boundary between the second semiconductor region and the drift region in the thickness direction of the semiconductor substrate is positioned farther upward than the bottom portion of the trench electrode.

8. The RB-IGBT according to claim 6, further comprising:
a well region having the first conductivity type and positioned on the front surface side of the semiconductor substrate; and
a first semiconductor region having the second conductivity type and provided between the well region and the second semiconductor region.

9. The RB-IGBT according to claim 6, wherein
an integrated value of the impurity concentration of impurities having the second conductivity type in the first and second semiconductor region from a boundary between the second semiconductor region and the drift region to the front surface of the semiconductor substrate is greater than or equal to $1E+11$ cm$^{-2}$ and less than or equal to $5E+11$ cm$^{-2}$.

10. The RB-IGBT according to claim 6, further comprising:
a third semiconductor region having the second conductivity type between the collector region having the first conductivity type and the drift region having the second conductivity type.

11. The RB-IGBT according to claim 10, wherein
an integrated value of the impurity concentration of impurities having the second conductivity type in the third semiconductor region from a boundary between the third semiconductor region and the collector region to a boundary between the third semiconductor region and the drift region is greater than or equal to $3E+11$ cm$^{-2}$ and less than or equal to $10E+11$ cm$^{-2}$.

12. The RB-IGBT according to claim 1, wherein
when the front surface of the semiconductor substrate is seen from an overhead view, the emitter trench portion is provided with a ring shape in a manner to sandwich at least one channel formation region that is directly below a gate electrode provided with a stripe shape.

* * * * *